US 11,248,294 B2

(12) United States Patent
Kato

(10) Patent No.: US 11,248,294 B2
(45) Date of Patent: Feb. 15, 2022

(54) SUBSTRATE PROCESSING APPARATUS

(71) Applicant: TOKYO ELECTRON LIMITED, Tokyo (JP)

(72) Inventor: Hitoshi Kato, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 461 days.

(21) Appl. No.: 15/976,354

(22) Filed: May 10, 2018

(65) Prior Publication Data

US 2018/0334745 A1 Nov. 22, 2018

(30) Foreign Application Priority Data

May 18, 2017 (JP) .............................. JP2017-099110

(51) Int. Cl.
*C23C 16/458* (2006.01)
*C23C 16/455* (2006.01)
*C23C 16/52* (2006.01)
*C23C 16/46* (2006.01)
*H01L 21/687* (2006.01)

(52) U.S. Cl.
CPC ...... *C23C 16/4584* (2013.01); *C23C 16/4586* (2013.01); *C23C 16/45536* (2013.01); *C23C 16/45551* (2013.01); *C23C 16/45578* (2013.01); *C23C 16/46* (2013.01); *C23C 16/52* (2013.01);
(Continued)

(58) Field of Classification Search
None
See application file for complete search history.

(56) References Cited

U.S. PATENT DOCUMENTS

2016/0122872 A1* 5/2016 Kato ....................... C23C 16/52
427/8

FOREIGN PATENT DOCUMENTS

JP    2010-212627 A    9/2010
JP    2016-92156 A     5/2016
(Continued)

OTHER PUBLICATIONS

Kato, Hitoshi. Japanese Patent Publication 2017-54881 English Machine Translation. Mar. 16, 2017. Translation performed on Jun. 1, 2021 from URL https://www.j-platpat.inpit.go.jp/c1800/PU/JP-2017-054881/A7E585E803C4F7047C424C66DD9663131BB7F55 5DB179EADF93A4DD4017A4C18/11/en (Year: 2017).*

Primary Examiner — Karla A Moore
Assistant Examiner — Tiffany Z Nuckols
(74) Attorney, Agent, or Firm — Nath, Goldberg & Meyer; Jerald L. Meyer; Tanya E. Harkins

(57) ABSTRACT

A substrate processing apparatus includes: a mounting stand for mounting a substrate thereon; a support rod for supporting the mounting stand from below; a revolution mechanism provided below the mounting stand and for supporting the support rod to revolve the mounting stand; a heating part provided between the mounting stand and the revolution mechanism as seen in a height direction and for heating a revolution region of the mounting stand; a heat transfer plate provided between the heating part and the revolution region and for radiating a heat generated from the heating part to the revolution region; and a processing gas supply part for supplying a processing gas to the revolution region. Each of the heating part and the heat transfer plate is divided into a center side and an outer side of the processing container via a gap so as to form a movement path of the support rod.

10 Claims, 15 Drawing Sheets

(52) U.S. Cl.
CPC .. *H01L 21/68764* (2013.01); *H01L 21/68771* (2013.01)

(56) References Cited

FOREIGN PATENT DOCUMENTS

| | | | | |
|---|---|---|---|---|
| JP | 2016-96220 A | 5/2016 | | |
| JP | 2016-122788 A | 7/2016 | | |
| JP | 2017054881 A | * 3/2017 | ....... | C23C 16/45536 |
| KR | 10-2016-0057322 A | 5/2016 | | |
| KR | 10-2016-0051650 A | 6/2016 | | |
| KR | 10-2017-0030043 A | 3/2017 | | |

* cited by examiner

Velocity difference [rpm]

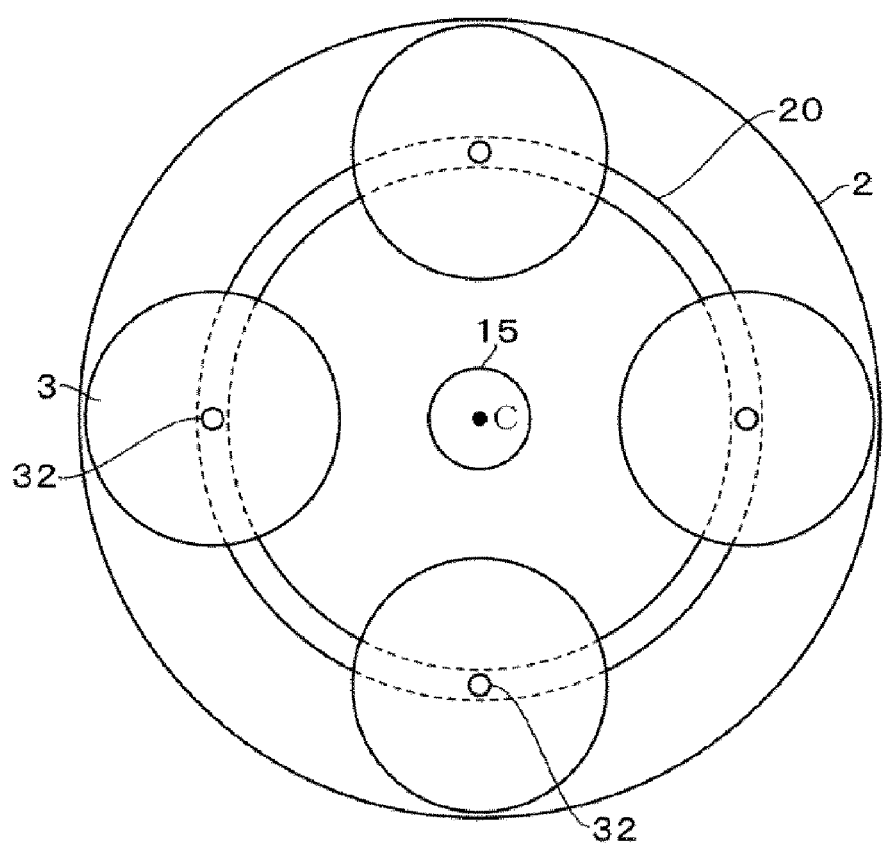

SUBSTRATE PROCESSING APPARATUS

CROSS-REFERENCE TO RELATED APPLICATION

This application is based upon and claims the benefit of priority from Japanese Patent Application No. 2017-099110, filed on May 18, 2017, the entire contents of which are incorporated herein by reference.

TECHNICAL FIELD

The present disclosure relates to a technique for subjecting a substrate to a film forming process by supplying a gas to a revolving substrate.

BACKGROUND

In a manufacturing process of a semiconductor device, for example, ALD (Atomic Layer Deposition) is performed in order to form various films for forming an etching mask and the like on a substrate, such as semiconductor wafer (hereinafter referred to as a wafer). In order to increase the productivity of the semiconductor device, as an apparatus for executing the above-mentioned ALD method, an apparatus has been used in which a plurality of wafers is revolved by rotating a rotary table on which the plurality of wafers are mounted, and is allowed to repeatedly pass through a processing gas supply regions defined along a radial direction of the rotary table. In order to form each of the above-mentioned films, CVD (Chemical Vapor Deposition) may be carried out in some cases. Similar to the ALD described above, it is conceivable that the film formation by CVD is performed by revolving the wafers.

Incidentally, in such a film forming apparatus for revolving the wafers, for example, quartz is used as a material of the rotary table from the viewpoint of strength and durability. However, quartz is heavy thereby applying a high load on a rotating shaft or a motor for rotating the rotary table. Therefore, if the rotary table is made large to increase the number of mounting stands and increase the number of processed wafers in order to enhance the throughput of the apparatus, there is a problem that the weight increases greatly, which increases the load borne by the rotating shaft or the motor.

In such a film forming apparatus for revolving the wafers, a purge gas is supplied between the rotary table and a bottom plate inside the processing chamber in order to suppress a backward flow of a processing gas. Further, holes through which lifting pins are moved up and down are formed in a wafer mounting portion of the rotary table so as to penetrate through the rotary table in the thickness direction. The lifting pins are moved up and down through the holes to take out the wafer from the wafer mounting portion. The rotary table is provided so as to cover the bottom plate over a wide range. Therefore, a gap defined under the rotary table is narrow, and an internal pressure of the gap is so high that the supplied purge gas cannot escape through the gap. As a result, the purge gas may be ejected from the holes of the mounting portion. There is a case where a structure for suppressing the displacement of the wafer is required.

SUMMARY

Some embodiments of the present disclosure provide a technique for limiting a load borne by a rotation mechanism for revolving a substrate in a substrate processing apparatus which supplies a processing gas to the substrate under revolution and performs a film forming process on the substrate.

According to one embodiment of the present disclosure, there is provided a substrate processing apparatus for performing a film formation by supplying a processing gas to a substrate inside a processing container, including: a mounting stand configured to mount the substrate thereon; a support rod configured to support the mounting stand from below; a revolution mechanism provided below the mounting stand and configured to support the support rod to revolve the mounting stand in a circumferential direction of the processing container; a heating part provided between the mounting stand and the revolution mechanism as seen in a height direction and configured to heat a revolution region of the mounting stand; a heat transfer plate provided between the heating part and the revolution region of the mounting stand and configured to radiate a heat generated from the heating part to the revolution region; and a processing gas supply part configured to supply the processing gas to the revolution region of the mounting stand, wherein each of the heating part and the heat transfer plate is divided into a center side and an outer side of the processing container via a gap so as to form a movement path of the support rod.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

FIGS. 13A and 13B are plan views showing an arrangement example of mounting stands according to an embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, as one embodiment of a substrate processing apparatus according to the present disclosure, a film forming apparatus 1 for executing ALD as a film forming process on a wafer W as a substrate will be described. The film forming apparatus 1 of this embodiment is an apparatus for forming a silicon oxide layer ($SiO_2$ layer) on a wafer W by causing a raw material gas containing silicon (Si) to react with an oxidizing gas which is a reaction gas reacting with the raw material gas. A series of such processes is repeated a plurality of times to form a $SiO_2$ film. Hereinafter, a case where a BTBAS (bistertiarybutylaminosilane) gas is used as the raw material gas and an ozone ($O_3$) gas is used as the oxidizing gas will be described as an example.

Figure 1:
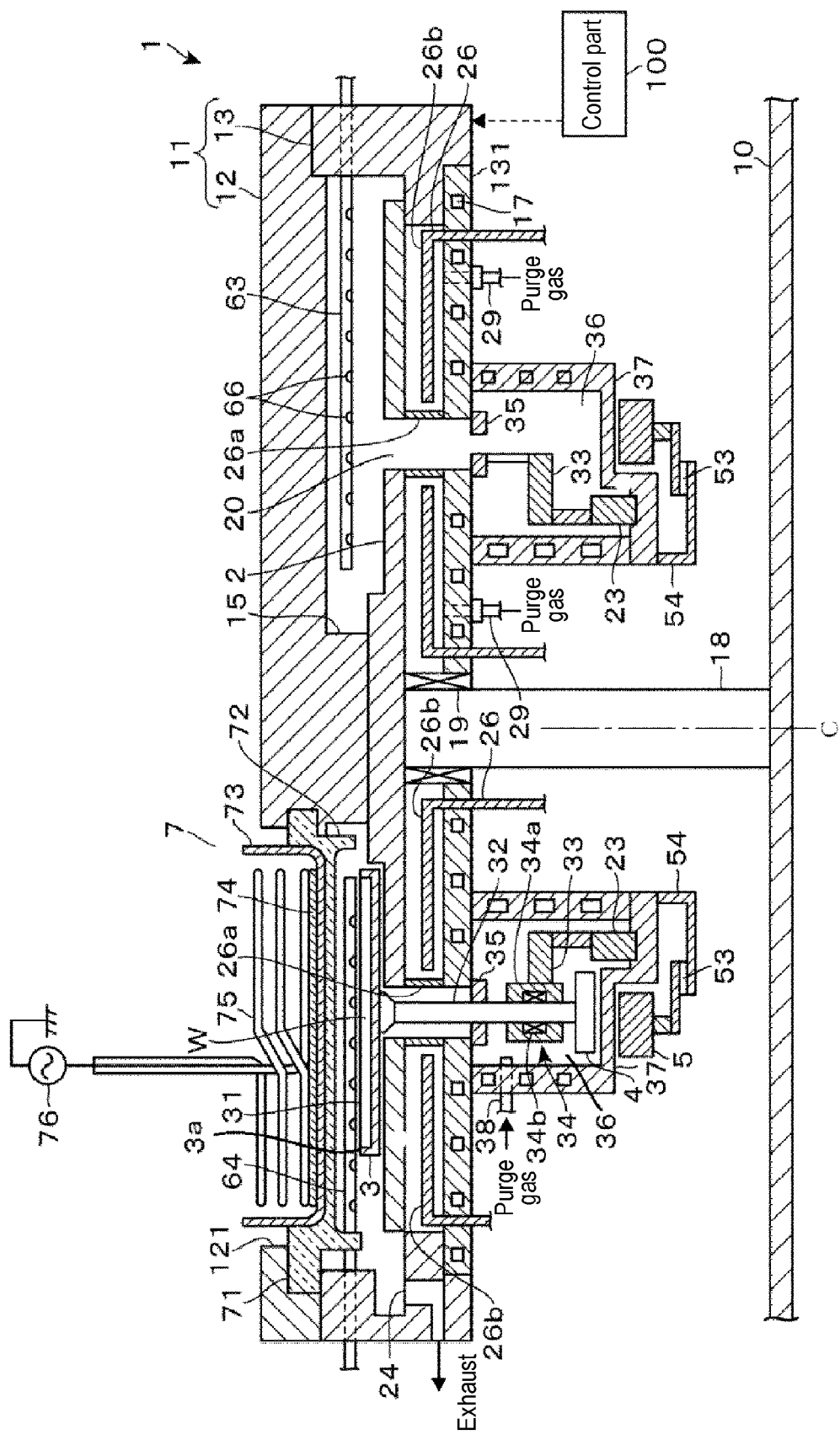
FIG. 1 is a vertical sectional side view showing a film forming apparatus to which a substrate processing apparatus of the present disclosure is applied.
Figure 2:
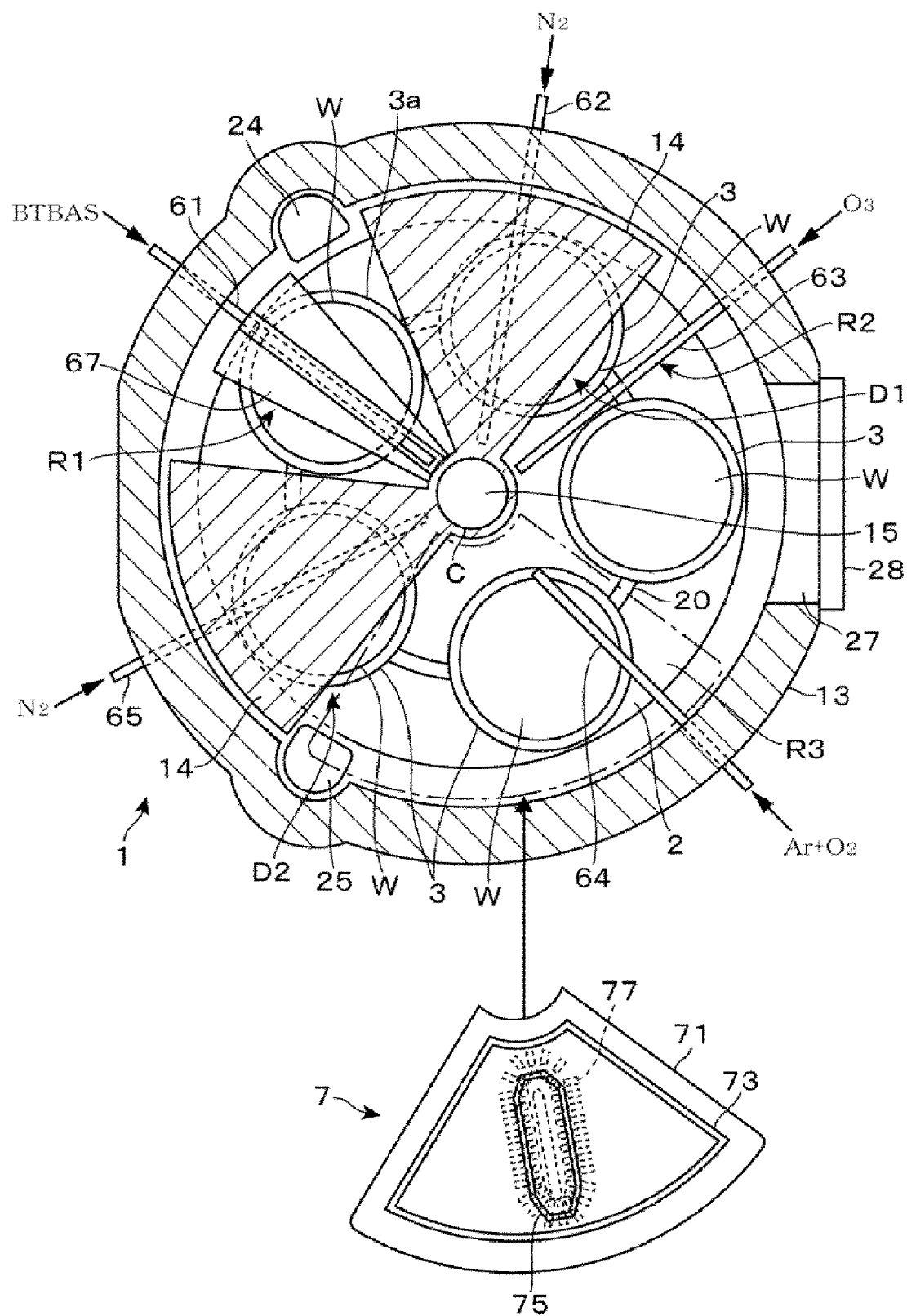
FIG. 2 is a horizontal sectional plan view of the film forming apparatus.

As shown in FIGS. 1 and 2, the film forming apparatus 1 according to the present disclosure includes a vacuum container 11 used as a processing container in which a film forming process is performed. The vacuum container 11 is configured as a flat container having a substantially circular plan-view shape, which includes a container body 13 that defines a side wall and a bottom portion of the vacuum container 11 and a top plate 12 that airtightly closes an upper opening of the container body 13. A support part (not shown) for supporting the vacuum container 11 is provided below the peripheral edge portion of the container body 13. The support part is fixed to, for example, a base 10.

Figure 3:
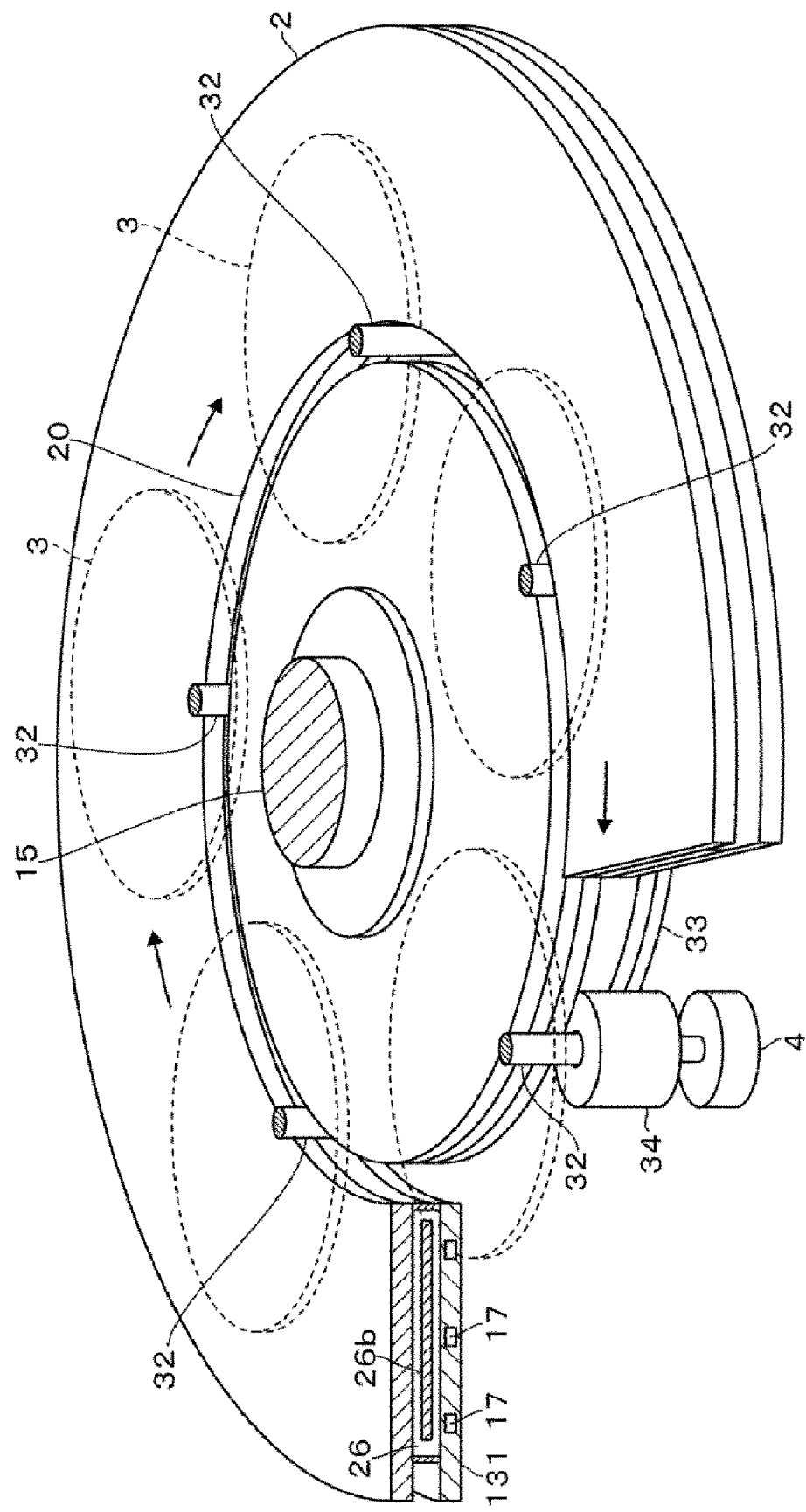
FIG. 3 is a schematic perspective view showing a cross section of a portion of a bottom plate portion of a container main body provided in the film forming apparatus.

As shown in FIGS. 1 and 3, a coolant flow path 17 through which a coolant flows is formed in a bottom plate portion 131 of the container body 13. Further, a heater 26 as a heating part for heating the wafer W is provided on an upper surface of the bottom plate portion 131. The heater 26 is configured by providing a heating wire 26b inside a flat quartz-made case body 26a. A disk-shaped quartz-made heat transfer plate 2 is provided on an upper surface of the heater 26. For example, a purge gas such as, for example, a nitrogen ($N_2$) gas or an argon (Ar) gas may be supplied from a purge gas supply mechanism 29 into the case body 26a.

In each of the bottom plate portion 131, the heater 26 and the heat transfer plate 2, a cutout portion (through hole portion) 20, which is an annular gap centered at the center of the film forming apparatus 1, is formed so as to penetrate the bottom plate portion 131, the heater 26 and the heat transfer plate 2 in the thickness direction. Therefore, the heat transfer plate 2 is divided into a central portion and a peripheral edge portion. As shown in FIG. 1, a columnar protrusion 15 protruding downward from the top plate 12 is close to the central portion of the heat transfer plate 2. A gap between the protrusion 15 and the heat transfer plate 2 has, for example, a labyrinth structure. For example, a purge gas (not shown) is supplied to the labyrinth structure. Because of the labyrinth structure and the purge gas, the gases supplied above the heat transfer plate 2 are prevented from being mixed with each other through the gap between the protrusion 15 and the heat transfer plate 2. Accordingly, an annular processing space is defined above the heat transfer plate 2 so as to surround the periphery of the protrusion 15. Further, a support post 18 for supporting the central portion of the lower surface of the heat transfer plate 2 is provided below the heat transfer plate 2. The support post 18 is fixed to the base 10. A magnetic seal 19 is provided in a gap between the support post 18 and the heater 26 and the bottom plate portion 131.

As shown in FIGS. 1 to 3, mounting stands 3 for holding respective wafers W are provided above the heat transfer plate 2. The mounting stands 3 are formed in a disk shape. For example, five mounting stands 3 are provided along the circumferential direction of the heat transfer plate 2 as shown in FIGS. 2 and 3. A recess 31 is formed in an upper surface of each of the mounting stands 3. Each of the wafers W is accommodated horizontally in the respective recess 31. At this time, an upper surface of an edge portion 3a formed around the periphery of the mounting stand 3 and an upper surface of the wafer W mounted in the recess 31 are flush with each other in height. In addition, holes through which lifting pins for delivering the wafer W move up and down are formed in the mounting stand 3 so as to penetrate the mounting stand 3 in the thickness direction. Details thereof will be described later.

Figure 4:
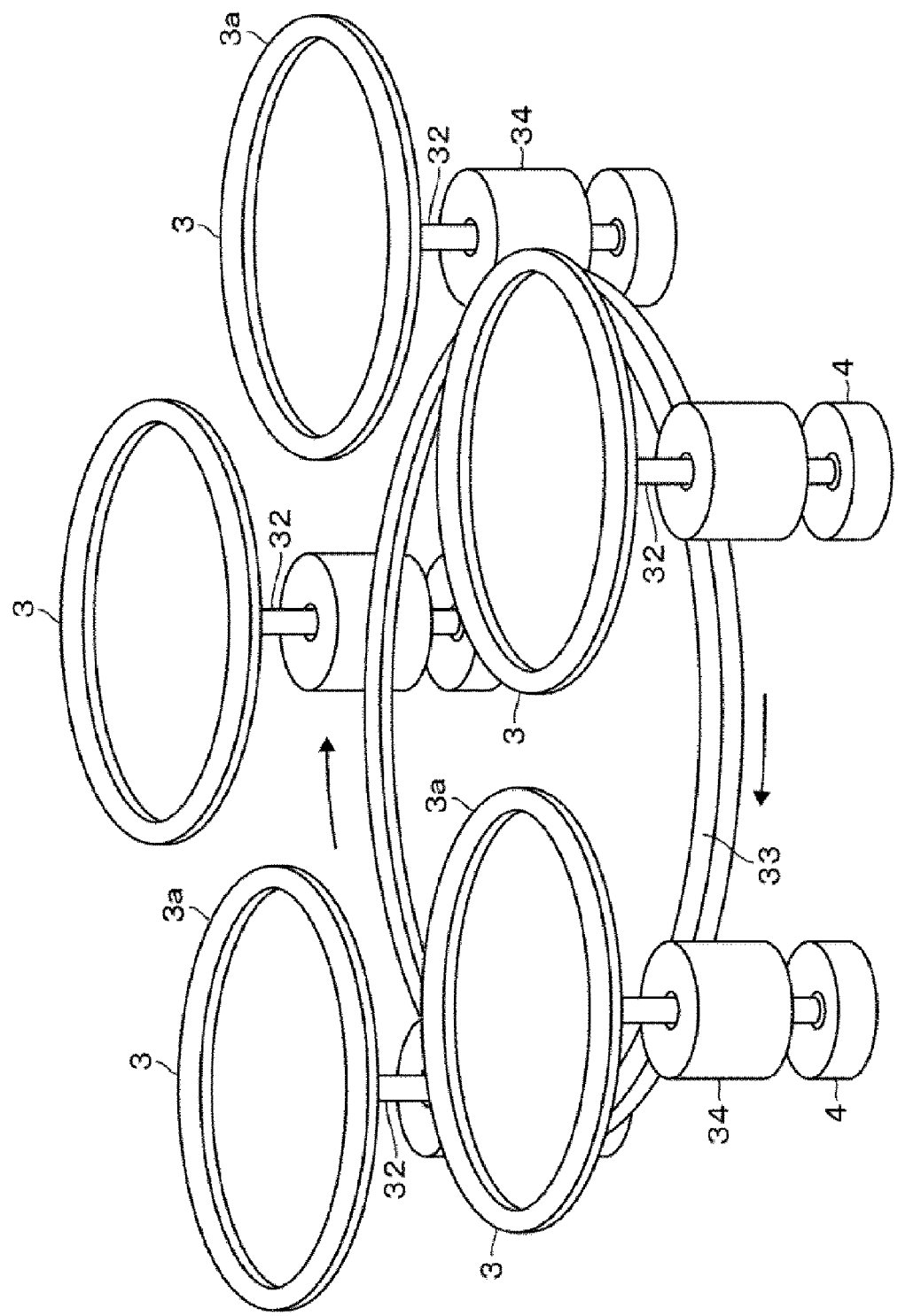
FIG. 4 is a perspective view showing a revolution mechanism of a mounting stand.

As shown in FIGS. 1, 3 and 4, a rotation shaft 32 for supporting the mounting stand 3 is provided in the central portion of a lower surface of the mounting stand 3 so as to extend vertically downward. The rotation shaft 32 is supported by a bearing unit 34. The bearing unit 34 includes a bearing 34b for rotatably holding the rotation shaft 32 and a magnetic seal 34a for preventing particles from scattering from the bearing 34b. A lower portion of the rotation shaft 32 penetrates the bearing unit 34. A driven gear 4 is provided at a lower end portion of the rotation shaft 32. A rotation mechanism for rotating each mounting stand 3 equipped with the driven gear 4 will be described later.

As shown in FIGS. 1 and 4, a side surface facing the center of the film forming apparatus 1 in the bearing unit 34 is connected to an outer peripheral surface of an annular rotation plate 33. In FIG. 4, five mounting stands 3 are shown to be fixed to the rotation plate 33. The respective mounting stands 3 are supported on the outer periphery of the rotation plate 33 at equal intervals. As shown in FIG. 3, each of the mounting stands 3 fixed to the rotation plate 33 is disposed such that the rotation shaft 32 is located in the cutout portion 20 formed in the bottom plate portion 131, the heater 26 and the heat transfer plate 2.

Although not shown in FIG. 4 for the sake of avoiding complexity, as shown in FIG. 1, a revolution-purpose rotating mechanism 23 formed of an annular direct drive motor (DD motor) for rotating the rotation plate 33 is provided below the rotation plate 33 so as to surround the periphery of the support post 18. As shown in FIG. 4, the rotation plate 33 is rotated by the rotating mechanism 23, for example, clockwise as seen from above, about the rotation axis C located at the center of the film formation apparatus 1 shown in FIG. 1. At this time, as shown in FIG. 3, the rotation axis 32 provided in each mounting stand 3 moves and revolves along the cutout portion 20 formed in the heat transfer plate 2. As a result, each mounting stand 3 revolves in the annular processing space above the heat transfer plate 2 along the circumferential direction of the heat transfer plate 2.

As shown in FIG. 1, an annular compartment 36 for sealing the periphery of the cutout portion 20 and keeping the interior of the vacuum container 11 at a vacuum is provided below the container body 13 along the cutout portion 20. A portion of the rotation shaft 32 of each mounting stand 3 below the bottom plate portion 131, respective components such as the driven gear 4 and the bearing unit 34 are accommodated in the compartment 36. In this case, the driven gear 4 is disposed such that the lower surface thereof faces, across a very narrow clearance, a partition surface 37 made of a material, for example, aluminum (Al) or stainless steel (SUS), which constitutes a bottom surface of the compartment 36 and passes magnetic force lines therethrough. Further, the rotation plate 33 and the revolution-purpose rotating mechanism 23 for revolving the mounting stands 3 are also installed inside the compartment 36. The revolution-purpose rotating mechanism 23 is fixed to the bottom surface of the compartment 36. The coolant flow path 17 is formed inside a side wall of the compartment 36.

A gas supply part 38 for supplying a purge gas into the compartment 36 is connected to the side wall of the compartment 36. By supplying the purge gas into the compartment 36 while processing the wafer W, it is possible to prevent the processing gas existing in the processing space from flowing into the compartment 36 via the cutout portion 20. Reference numeral 35 in FIG. 1 denotes an annular partition ring provided along the cutout portion 20 at a lower end portion of the cutout portion 20 and having a movement path for the rotation shaft 32. The annular partition ring 35 is provided in order to separate gases between the processing surface and a region below the processing surface.

Figure 5:
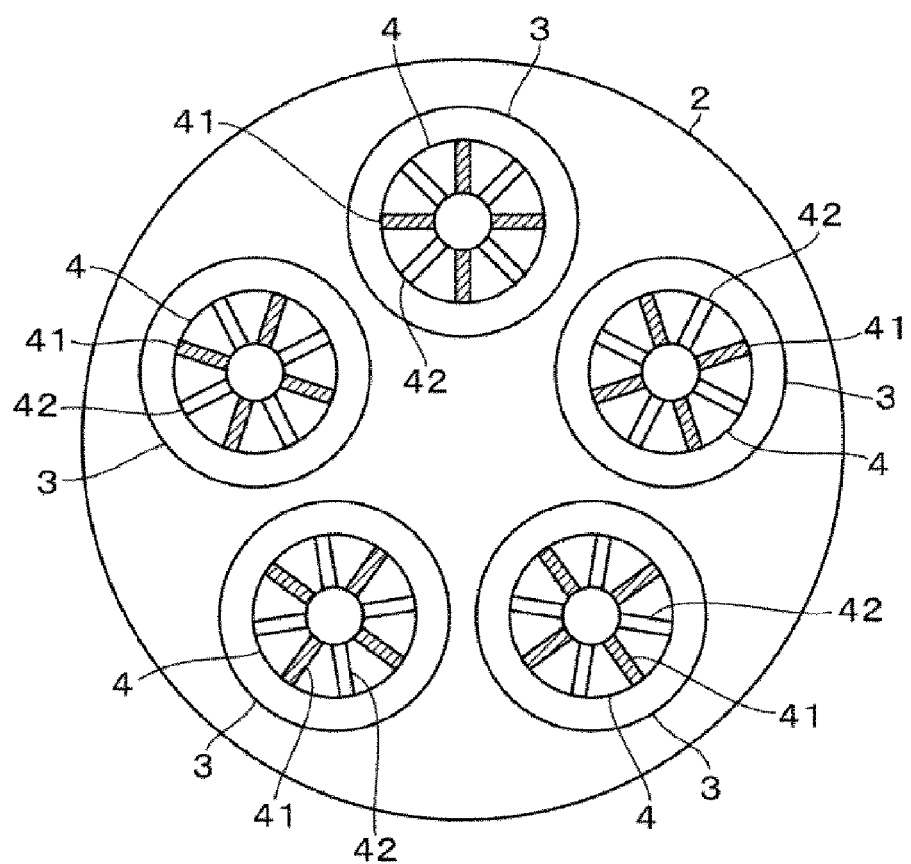
FIG. 5 is a plan view schematically showing driven gears as viewed from below.

Next, the rotation mechanism of the mounting stand 3 will be described. FIG. 5 is a view showing the above-described driven gears 4 viewed from below. In FIG. 5, the driven gears 4 are schematically shown. Each of the driven gears 4 is formed in a disk shape and is connected to the rotation shaft 32 with the central axes thereof aligned with one another. Therefore, the driven gear 4 is connected to the mounting stand 3 via the rotation shaft 32. As the mounting stand 3 revolves, the driven gear 4 revolves along the movement path of the mounting stand 3. Since the bearing unit 34 rotatably holds the rotation shaft 32, when the driven gear 4 is rotated in the circumferential direction, each mounting stand 3 can be rotated about the respective rotation shaft 32.

N-pole portions 41 and S-pole portions 42, which are magnetic pole portions made of permanent magnets, are alternately arranged along the rotation direction in a the lower surface of each of the driven gears 4. The N-pole portions 41 are indicated by hatching so as to distinguish them from the S-pole portions 42. In this example, for example, twenty N-pole portions 41 and twenty S-pole portions 42 exposed from the lower surface of the driven gear 4 are formed in the same strip shape and are arranged at intervals in the circumferential direction so as to radially extend in a transverse direction from the central portion of the lower surface of the driven gear 4. For example, the length of the N-pole portions 41 and the S-pole portions 42 is set shorter than the radius of the driven gear 4 so as not to exceed the center of the bottom surface of the driven gear 4.

Figure 6:
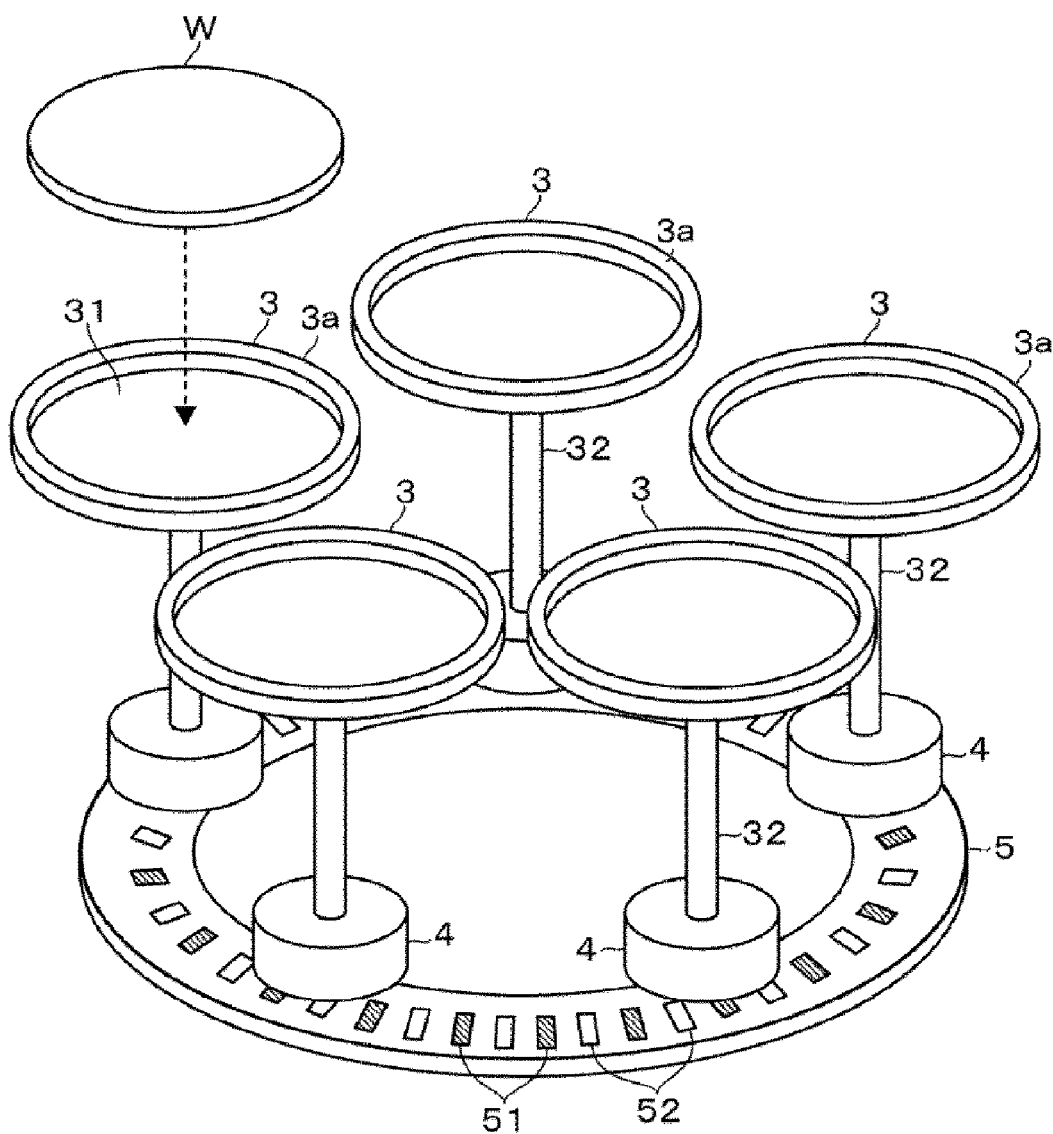
FIG. 6 is a schematic perspective view schematically showing driven gears and a driving gear.

As shown in FIGS. 1 and 6, an annular driving gear 5 is disposed below the compartment 36 (at the atmospheric side) so as to face the driven gears 4. In FIG. 6, the driven gears 4 and the driving gear 5 are depicted close to each other, and the partition surface 37 is not shown. The driving gear 5, which constitutes a magnetic gear mechanism with the driven gears 4, is provided so as to face a revolution trajectory of the driven gears 4. The driving gear 5 of this example is formed of an annular plate-like member. The center of the driving gear 5 is disposed so as to be aligned with the rotation axis C of the rotation plate 33 (the revolution center of the mounting stand 3). N-pole portions 51 and S-pole portions 52, which are magnetic pole portions made of permanent magnets, are alternately arranged on an upper surface of the driving gear 5 along the revolution trajectory of the driven gears 4 over the entire circumference.

Figure 7:
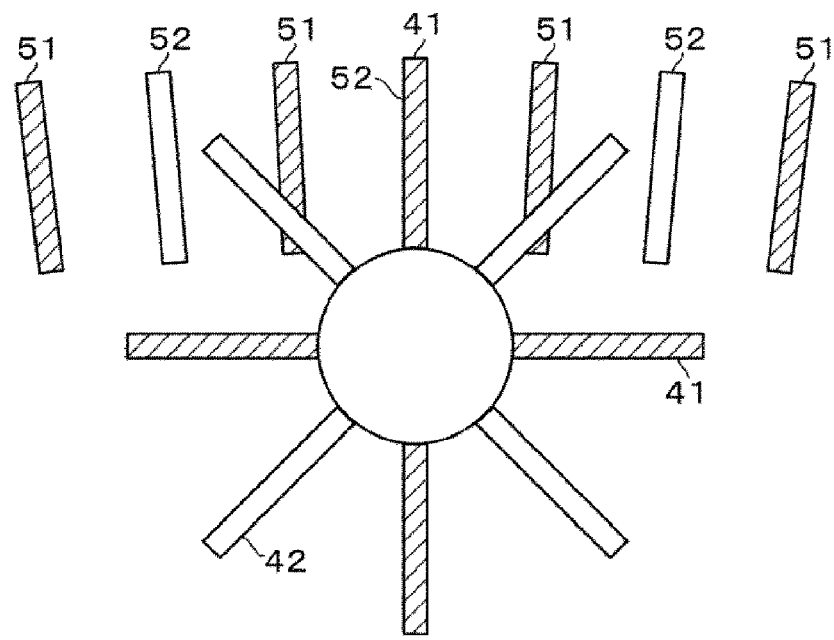
FIG. 7 is a plan view showing one of the driven gears and a portion of the driving gear.

The N-pole portions 51 and the S-pole portions 52, which are the respective magnetic pole portions of the driving gear 5, are arranged in a surface of the driving gear 5, which faces the lower surfaces of the driven gears 4. In FIG. 7, the magnetic pole portions (the N-pole portions 41 and the S-pole portions 42) of one of the driven gears 4 are depicted in a corresponding relationship with the magnetic pole portions (the N-pole portions 51 and the S-pole portions 52) of the driving gear 5, which are disposed below the driven gears 4. As described above, for example, the N-pole portions 51 and the S-pole portions 52 exposed from the surface of the annular driving gear 5 are formed in, for example, a strip shape so as to overlap with the shape of the N-pole portions 41 and the S-pole portions 42 formed in the lower surfaces of the driven gears 4, which are located opposite the surface of the driving gear 5.

Figure 8:
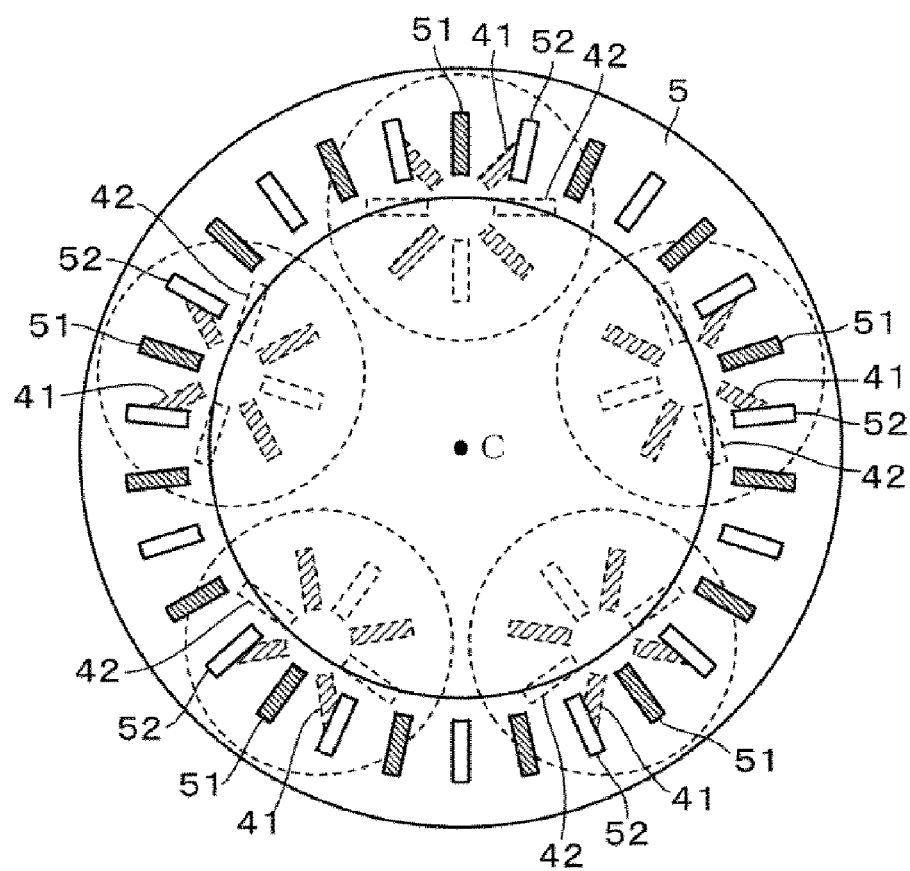
FIG. 8 is a plan view schematically showing the driven gears and the driving gear.

In FIG. 7, a state is illustrated in which the N-pole portion 41 of the driven gear 4 and the S-pole portion 52 of the driving gear 5 overlap with each other. FIG. 8 shows the arrangement of the N-pole portions 51 and the S-pole portions 52 of the driving gear 5. FIGS. 7 and 8 do not represent the number of magnetic pole portions which is assumed when configured as an actual machine but show the number of magnetic pole portions for the sake of a clear understanding of the technology. For example, in an actual example of the driving gear 5, the total number of N-pole portions 51 and S-pole portions 52 is about 300.

Returning to FIG. 1, a rotation-purpose rotating mechanism 53 formed of, for example, an annular DD motor for rotating the driving gear 5, is provided in a lower surface of the driving gear 5. By rotating the rotation-purpose rotating mechanism 53, the driving gear 5 is rotated about the rotation axis C as a rotation center. Therefore, the driving gear 5 and the mounting stand 3 under revolution rotate about the same rotation axis C. The rotation-purpose rotating mechanism 53 is provided on an annular support plate 54 installed so as to extend downward from the compartment 36.

Next, the revolution and rotation of the mounting stands 3 will be described. FIG. 8 schematically shows a state in which the five driven gears 4 are respectively stopped to partially face the driving gear 5 in a state in which the mounting stands 3 and the driving gear 5 are stopped (in a state in which the mounting stands 3 and the driving gear 5 are not rotating). The driven gears 4 are stopped at positions determined by the overall action of an attraction force and a repulsion force acting between the respective magnetic pole portions (the N-pole portions 41 and the S-pole portions 42) of the driven gears 4 and the magnetic pole portions (the N-pole portions 51 and the S-pole portions 52) of the driving gear 5. Therefore, when the mounting stands 3 and the driving gear 5 are rotated at the same rotation number (rotation speed: rpm), the driven gears 4 are stopped relative to the driving gear 5. Thus, the driven gears 4, namely the mounting stands 3, are stopped without rotating about their own axes.

Figure 9:
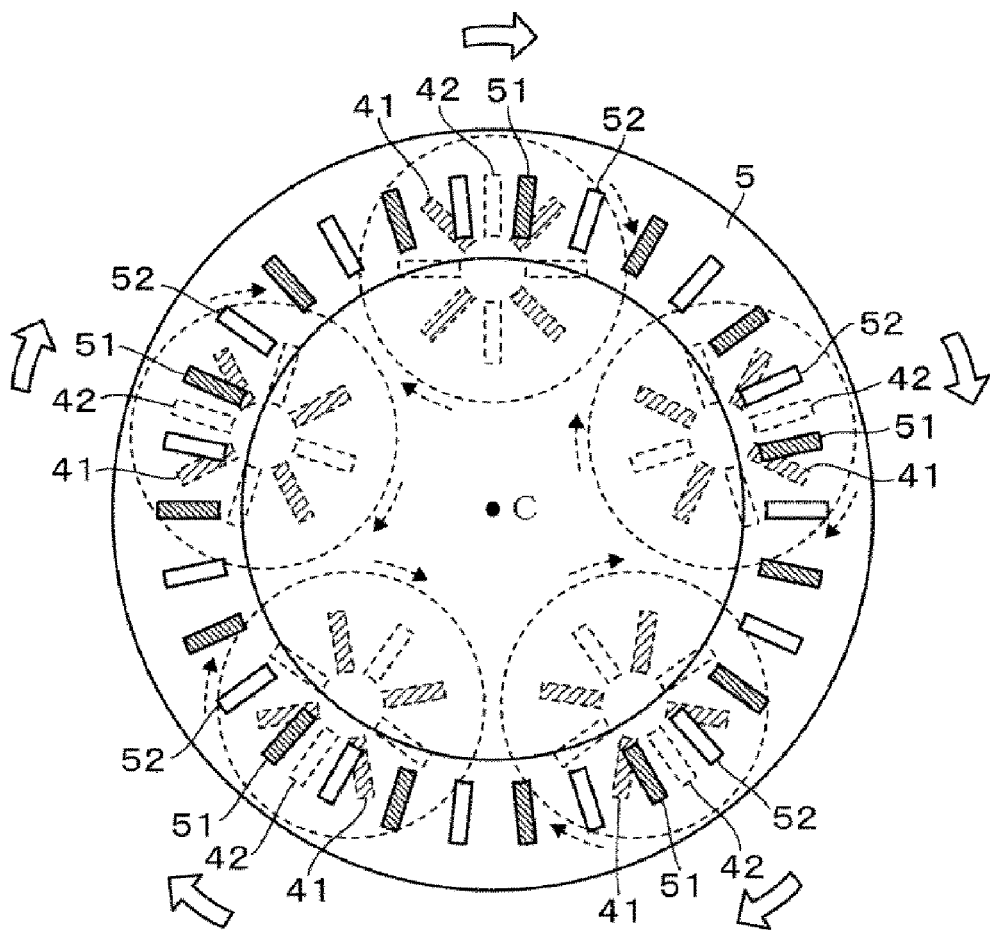
FIG. 9 is a plan view schematically showing the driven gears and the driving gear.

The mounting stands 3 are rotated about their own axes when a difference is generated between the rotation speed of the driving gear 5 and the revolution number of the mounting stands 3, namely when a velocity difference is generated between an angular velocity of the driving gear 5 and an angular velocity (so-called revolution angular velocity) of the driven gears 4 with the revolution of the mounting stands 3. When the angular velocity Va of the driving gear 5 is larger than the angular velocity Vb of the driven gear 4 (when the velocity difference obtained by subtracting the angular velocity of the driven gear 4 from the angular velocity of the driving gear 5 is positive), the arrangement of the N-pole portions 51 and the S-pole portions 52 of the driving gear 5 moves from the left side toward the right side in FIG. 7 under the arrangement of the N-pole portions 41 and the S-pole portions 42 of the driven gear 4 facing the driving gear 5. Therefore, the repulsion force and the attraction force from the driving gear 5 acting on the driven gears 4 transitions to the right side. Along with this, the arrangement of the N-pole portions 41 and the S-pole portions 42 of the driven gears 4 also moves to the right side. As a result, each of the driven gears 4 rotates about their own axes toward the right side in FIG. 8, namely in a clockwise direction from the state shown in FIG. 8 to the state shown in FIG. 9.

When the angular velocity Va of the driving gear 5 is smaller than the angular velocity Vb of the driven gear 4 (when the velocity difference obtained by subtracting the angular velocity of the driven gear 4 from the angular velocity of the driving gear 5 is negative), the arrangement of the N-pole portions 51 and the S-pole portions 52 of the driving gear 5 moves from the right side to the left side in FIG. 7 under the arrangement of the N-pole portions 41 and the S-pole portions 42 of the driven gear 4 facing the driving gear 5. Therefore, the repulsion force and the attraction force from the driving gear 5 acting on the driven gear 4 transitions to the left side. Along with this, the arrangement of the N-pole portions 41 and the S-pole portions 42 of the driven gear 4 also moves to the left side. As a result, each of the driven gears 4 rotates about their own axes toward the left side in FIG. 8, namely in a counterclockwise direction.

Figure 10:
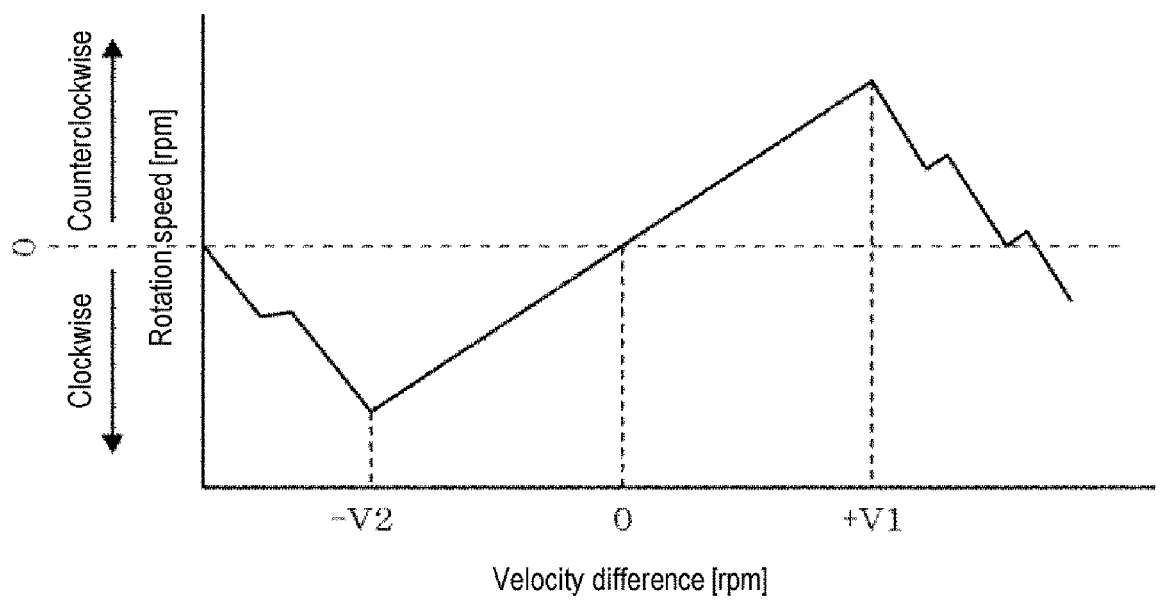
FIG. 10 is a characteristic diagram showing the relationship between the velocity difference between the angular velocity of the driven gears and the angular velocity of the driving gear and the rotation speed of the driven gears.

The present inventors found that as shown in FIG. 10, the velocity difference between the angular velocity of the driven gear 4 due to the revolution and the angular velocity of the driving gear 5 and the rotation speed of the driven gear 4 are maintained in a substantially proportional relationship in a range where a velocity difference exists. In FIG. 10, the horizontal axis represents the velocity difference (Va−Vb) between the angular velocity Va of the driving gear 5 and the angular velocity Vb of the driven gear 4 due to the revolution, and the vertical axis represents the rotation speed of the driven gear 4. When the velocity difference is positive ((Va−Vb)>0), the clockwise rotation speed increases as the velocity difference increases from 0 to +V1. When the velocity difference is negative ((Va−Vb)<0), the counterclockwise rotation speed increases as the velocity difference increases from 0 to −V2. For example, the angular velocity of the driving gear 5 is set up to a value at which the velocity difference and the rotation speed of the driven gear 4 are maintained in a substantially proportional relationship.

As described above, the mounting stand 3 rotates about its own axis when there is a difference in the rotation number between the driving gear 5 and the mounting stands 3 under revolution. The rotation speed at this time is obtained by a gear ratio of the driving gear 5 and the driven gear 4×a rotation speed difference. The rotation speed difference refers to the velocity difference between the angular velocity of the driving gear 5 and the angular velocity of the driven gear 4 (so-called revolution angular velocity) due to the revolution of the mounting stands 3. In a model in which the driving gear 5 is constituted by 300 magnetic pole portions (N-pole portions 51 and S-pole portions 52) and the driven gear 4 is constituted by 18 magnetic pole portions (N-pole portions 41 and S-pole portions 42), for example, when the revolution number of the mounting stands 3 is 30 rpm, the rotation speed in the case of advancing the driving gear 5 by 0.1 degree/second (6 degrees/minute) is obtained as follows. The gear ratio is 300/18=16.67 and the rotation speed difference is 6/360 rpm. Therefore, the rotation speed of the driven gear 4 is the gear ratio×the rotation speed difference, i.e., 300/1×6/360=0.278 rpm (100 degrees/min). The rotation speed obtained in this way coincides with data on a rotation speed obtained in an evaluation test described later.

The relationship between the velocity difference between the angular velocity Vb of the driven gear 4 and the angular velocity Va of the driving gear 5 and the rotation speed of the driven gear 4 varies depending on a magnetic force magnitude, shape and arrangement of the N-pole portions 41 and 51 and the S-pole portions 42 and 52 constituting the driven gears 4 and the driving gear 5, a distance between the driven gears 4 and the driving gear 5, film forming process conditions, and the like. Therefore, for example, the relationship between the velocity difference between the angular velocity Vb of the driven gear 4 due to the revolution and the angular velocity Va of the driving gear 5 and the rotation speed of the driven gear 4 is acquired in advance.

Next, a gas supply system and an exhaust system will be described. Returning to FIGS. 1 and 2, a raw material gas nozzle 61, a separation gas nozzle 62, an oxidizing gas nozzle 63, a modifying gas nozzle 64 and a separation gas nozzle 65 are arranged above the heat transfer plate 2 in the film forming apparatus 1 in the named order at intervals in the circumferential direction of the heat transfer plate 2. Each of the gas nozzles 61 to 65 is formed in a bar shape extending horizontally along the radial direction of the heat transfer plate 2 from the side wall of the vacuum container 11 toward the central portion thereof. Each of the gas nozzles 61 to 65 discharges various gases downward from a large number of discharge holes 66 formed so as to be spaced apart from each other along the length direction thereof.

The raw material gas nozzle 61, which is a first gas supply part, discharges a BTBAS gas. In FIG. 2, reference numeral 67 denotes a nozzle cover that covers the raw material gas nozzle 61. The nozzle cover 67 serves to increase the concentration of the BTBAS gas existing below nozzle cover 67. The oxidizing gas nozzle 63, which is a second gas supply part, discharges an $O_3$ gas. The separation gas nozzles 62 and 65, which are separation gas supply parts, are configured to discharge an $N_2$ gas and are disposed at positions at which protrusion portions 14 and 14 of the top plate 12 are spaced apart from each other in the circumferential direction when viewed from the top. The modifying gas nozzle 64 discharges a modifying gas composed of, for example, a mixed gas of an argon (Ar) gas and an oxygen ($O_2$) gas. In this example, each of the raw material gas, the oxidizing gas and the modifying gas corresponds to a processing gas. Each of the raw material gas nozzle 61, the oxidizing gas nozzle 63 and the modifying gas nozzle 64 corresponds to a processing gas supply part for supplying the processing gas.

In the top plate 12, a plasma generating part 7 is provided above the modifying gas nozzle 64. In FIG. 2, a position where the plasma generating part 7 is provided is indicated by a one-dot chain line. Reference numeral 71 in FIGS. 1 and 2 denotes a main body made of a dielectric material such as quartz or the like. A protrusion 72 is provided on a lower surface of the main body 71 along a fan-like opening 121 formed in the top plate 12. The modifying gas is discharged from the modifying gas nozzle 64 into a region surrounded by the protrusion 72.

An antenna 75 formed by winding a metal wire in a coil shape is provided above the main body 71 via a Faraday shield 73 and an insulating plate member 74. A high frequency power source 76 is connected to the antenna 75. Reference numeral 77 in FIG. 2 denotes slits for directing a magnetic field component of an electromagnetic field downward.

In the processing space above the heat transfer plate 2, a region below the raw material gas nozzle 61 corresponds to an adsorption region R1 as a first processing region where the BTBAS gas is adsorbed, and a region below the oxidizing gas nozzle 63 corresponds to an oxidation region R2 as a second processing region where the BTBAS gas is oxidized. Furthermore, a region below the plasma generating part 7 corresponds to a modification region R3 in which the $SiO_2$ film is modified by the plasma. Regions below the protrusion portions 14 and 14 respectively formed at upstream and downstream sides in the revolution direction of the mounting stands 3 as viewed from the raw material gas nozzle 61 correspond to separation regions D1 and D2 by which the adsorption region R1 and the oxidation region R2 are separated from each other by the $N_2$ gas discharged from the separation gas nozzles 62 and 65.

The exhaust port 24 is opened outward between the adsorption region R1 and the separation region D1 defined adjacent to the adsorption region R1 at the downstream side in the revolution direction of the mounting stands 3 as viewed from the adsorption region RE The exhaust port 24 exhausts an excess BTBAS gas. Furthermore, an exhaust port 25 is opened outward in the vicinity of the boundary between the modification region R3 and the separation region D2 defined adjacent to the modification region R3 at the downstream side in the revolution direction of the mounting stands 3 as viewed from the modification region R3. The exhaust port 25 exhausts an excess $O_3$ gas and an excess modifying gas. The $N_2$ gas supplied to each of the separation regions D1 and D2 is also exhausted from the exhaust ports 24 and 25. In addition, as shown in FIG. 2, for example, the exhaust ports 24 and 25 for exhausting the interior of the vacuum container 11 are opened outward of the heat transfer plate 2 in the bottom plate portion 131. A vacuum exhaust mechanism (not shown) equipped with a vacuum pump or the like is connected to the exhaust ports 24 and 25.

Figure 11:
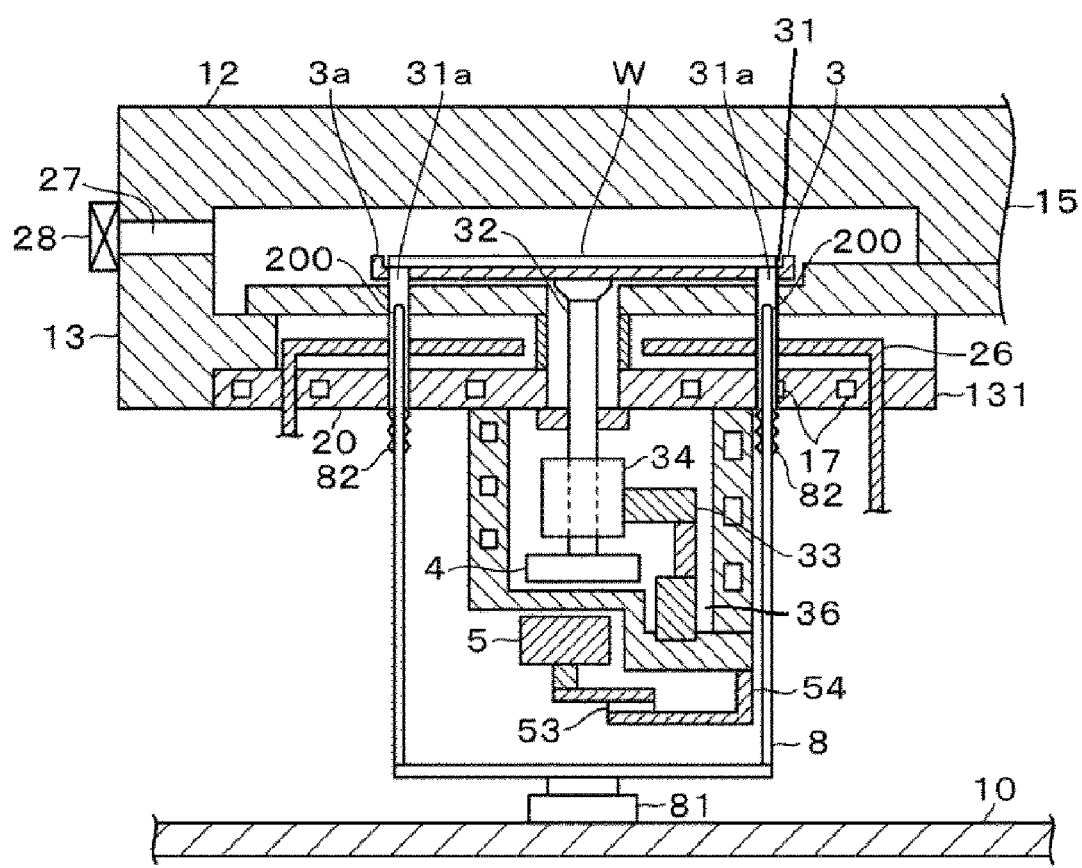
FIG. 11 is a vertical sectional view showing an elevating mechanism for raising and lowering a wafer mounted on a mounting stand.

As shown in FIGS. 2 and 11, a loading/unloading port 27 configured to be freely opened and closed by a gate valve 28 is formed in the side wall surface of the vacuum container 11 (the container body 13). The wafer W held by an external transfer mechanism (not shown) is loaded into the vacuum container 11 via the loading/unloading port 27 and is delivered onto the mounting stand 3. As shown in FIG. 11, in the vicinity of the loading/unloading port 27 in the film forming apparatus 1, through-holes 200 penetrating the bottom plate portion 131, the heater 26 and the heat transfer plate 2 are formed at positions corresponding to hole portions 31a formed in the mounting stand 3 located at the delivery position of the wafer W. Lifting pins 8 as lifting members are disposed in the respective through-holes 200. The lifting pins 8 are disposed so as not to interfere with the annular compartment 36 formed on the lower surface of the vacuum container 11 and are configured to be raised and lowered by a lifting mechanism 81 provided on the base 10 of the film forming apparatus 1. Thus, the lifting pins 8 move up and down through the respective hole portions 31a formed in the mounting stand 3.

Figure 12:
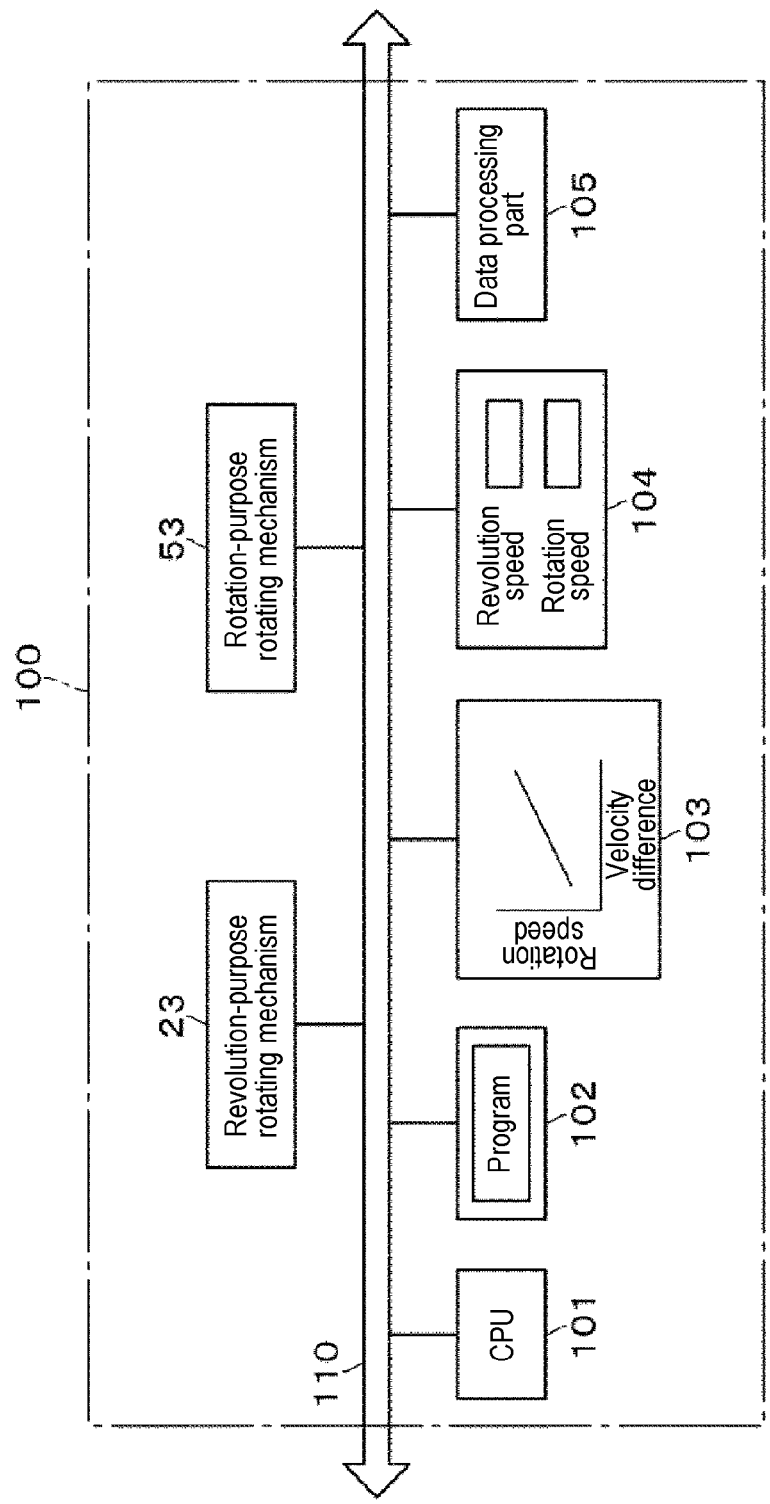
FIG. 12 is a configuration diagram showing an example of a control part provided in the film forming apparatus.

As shown in FIG. 12, the film forming apparatus 1 is provided with a control part 100 composed of a computer for controlling the overall operation of the apparatus 1. The control part 100 includes a CPU 101, a program storage part 102 that stores a program for executing an operation relating to a film forming process described later, a memory part 103, an input part 104, and a data processing part 105. Reference numeral 110 in FIG. 12 denotes a bus to which the revolution-purpose rotating mechanism 23 for the mounting stands 3 and the rotation-purpose rotating mechanism 53 for the mounting stand 3 are connected.

The memory part 103 stores, for example, the relationship between the rotation speed of the driven gear 4 and the velocity difference between the angular velocity of the driven gear 4 due to the revolution and the angular velocity of the driving gear 5 as shown in FIG. 10. The input part 104 is formed of, for example, an operation screen, and is used for inputting the rotation speed of the driven gear 4 and the angular velocity of the driven gear 4 due to the revolution (the revolution number of the mounting stands 3). In FIG. 12, the angular velocity due to the revolution is defined as a revolution speed. The data processing part 105 is configured to set the rotation number of the driving gear 5 based on the rotation speed of the driven gear 4 and the revolution number of the mounting stands 3 inputted in advance, and the relationship stored in the memory part 103. The rotation speed of the driven gear 4 and the angular velocity of the driven gear 4 due to the revolution may be inputted during maintenance, for example. If the rotation speed and the angular velocity of the driven gear 4 are inputted, the data processing part 105 grasps the velocity difference between the angular velocity of the driven gear 4 due to the revolution and the angular velocity of the driving gear 5 from the aforementioned relationship on the basis of the inputted rotation speed, and then sets the rotation number of the driving gear 5.

The program described above allows the control signal to be transmitted to each part of the film forming apparatus 1 to control the operation of each part. For example, the rotation speed of the mounting stand 3 is written, for example, in the recipe of the film forming process. By selecting the recipe, a supply flow rate of each processing gas or the like from each of the gas nozzles 61 to 65, a heating temperature of the wafer W heated by the heater 26, the revolution of the mounting stands 3 performed by the revolution-purpose rotating mechanism 23, the rotation of the mounting stands 3 performed by the magnetic gear mechanism, and the like are controlled according to the control signal. The aforementioned program incorporates a group of steps for performing these controls and executing each process to be described later. The program is installed on the control part 100 through a storage medium such as a hard disk, a compact disk, a magneto-optical disk, a memory card or the like.

Hereinafter, the operation of the film forming apparatus 1 configured as above will be described. First, while intermittently revolving the mounting stands 3, each mounting stand 3 is moved to a position facing the loading/unloading port 27. A wafer W is loaded into the vacuum container 11 by a transfer mechanism (not shown) and is delivered to the mounting stand 3. After the wafers W are mounted on all the mounting stands 3, the transfer mechanism is withdrawn from the vacuum container 11 and is moved back. The gate valve 28 is closed, and the interior of the vacuum container 11 is evacuated to have a predetermined internal pressure via the exhaust ports 24 and 25. An $N_2$ gas is supplied to the processing space from the separation gas nozzles 62 and 65. The heating of the wafer W by the heater 26 is started to heat the wafer W to a temperature of, for example, 200 degrees C. or lower.

For example, the mounting stand 3 is revolved by the revolution-purpose rotating mechanism 23 at a revolution speed of 80 rpm or more, for example, 120 rpm. The driving gear 5 is rotated at the same speed as the revolution speed of the mounting stand 3 by the rotation-purpose rotating mechanism 53. As a result, the mounting stands 3 revolve about their own axes with the rotation stopped. Subsequently, inside the vacuum container 11, the supply of the respective processing gases from the raw material gas nozzle 61, the oxidizing gas nozzle 63 and the modifying gas nozzle 64, and the generation of plasma by the application of a high frequency to the antenna 75 from the high frequency power source 76 are started. In addition, for example, in conformity with the supply of the respective processing gases, the driving gear 5 is rotated by the rotation-purpose rotating mechanism 53, whereby the mounting stands 3 are rotated about their own axes at a predetermined rotation speed.

As shown in FIG. 2, in the vacuum container 11, the separation region D1 to which the $N_2$ gas is supplied is defined between the adsorption region R1 and the oxidation region R2. Therefore, the raw material gas supplied to the adsorption region R1 and the oxidizing gas supplied to the oxidation region R2 are exhausted without being mixed with each other above the heat transfer plate 2. Furthermore, the separation region D2 to which the $N_2$ gas is supplied is also defined between the adsorption region R1 and the modification region R3. Therefore, the raw material gas, and the modifying gas supplied to the modification region and the oxidizing gas flowing from the upstream side of the modification region R3 in the rotation direction to the separation region D2 are not mixed with each other above the heat transfer plate 2 and are exhausted from the exhaust ports 24 and 25.

As described above, each wafer W sequentially passes through the adsorption region R1, the oxidation region R2 and the modification region R3 in a state in which the supply and exhaust of the respective gases are performed as described above. In the adsorption region R1, the BTBAS gas discharged from the raw material gas nozzle 61 is adsorbed onto the wafer W. In the oxidation region R2, the adsorbed BTBAS gas is oxidized by the $O_3$ gas supplied from the oxidizing gas nozzle 63, whereby one or more molecular layers of $SiO_2$ are formed. In the modification region R3, the molecular layers of $SiO_2$ are modified by being exposed to the plasma of the modifying gas. With the revolution of the mounting stand 3, the above-described cycles are repeatedly executed a plurality of times, whereby the molecular layers of $SiO_2$ are stacked one above another and an $SiO_2$ film is formed on the surface of each of the wafers W.

In the film forming apparatus 1, in parallel to the revolution of the mounting stand 3, the wafers W are rotated with the revolution of the mounting stand 3. The revolution number of the mounting stand 3 and the rotation speed of the mounting stand 3 are set so as not to synchronize the revolution of the mounting stand 3 and the rotation of the mounting stand 3 with each other. That is to say, the revolution number of the mounting stand 3 and the rotation speed of the mounting stand 3 are set so that the wafer W is rotated about its own axis at such a rotation speed that the mounting stand 3 makes one revolution from a start point in a state in which the wafer W is oriented in a first direction and, when the mounting stand 3 is positioned at the start point again, the wafer W is oriented in a second direction different from the first direction.

As described above, the mounting stand 3 rotates without synchronization with the revolution of the mounting stand 3. Therefore, the wafer W mounted on each mounting stand 3 passes through the adsorption region R1 of the raw material gas in various orientations due to the rotation and revolution thereof. In this way, the cycle of forming the above-mentioned molecular layer of $SiO_2$ is executed while gradually changing the orientation of the wafer W viewed from the top along with the rotation of the mounting stand 3. By performing the film formation while changing the orientation of the wafer W, for example, even if the concentration distribution of the raw material gas is varied in the adsorption region R1, the amount of the raw material gas adsorbed onto the wafer W can be made uniform in the circumferential direction of the wafer W when viewed in terms of the entire period of the formation cycle of the $SiO_2$ molecular layer executed a plurality of times. As a result, as seen in the circumferential direction of the wafer W, it is possible to suppress a variation in the film thickness of the $SiO_2$ film formed on the wafer W.

By the above-described operation, the molecular layers of $SiO_2$ are sequentially stacked one above another. After a preset number of cycles is executed, the revolution of the mounting stand 3, the supply of various gases, the generation of plasma, and the operation of the revolution-purpose rotating mechanism 23 and the rotation-purpose rotating mechanism 53 are stopped to terminate the film forming process. Thereafter, the internal pressure of the vacuum container 11 is adjusted. The gate valve 28 is opened to allow the external transfer mechanism to enter the vacuum container 11. The wafer W is unloaded from the vacuum container 11 in the procedure opposite to the loading procedure.

As described above, in the film forming apparatus 1, the revolution and the rotation are performed in parallel with each other during the film formation on the wafer W. However, the rotation of the wafer W (the mounting stand 3) includes not only a case where the wafer W is continuously rotated about its own axis during the revolution of the mounting stand 3 but also a case where the wafer W is intermittently rotated about its own axis during the revolution of the mounting stand 3. In addition, timings of starting and stopping the rotation of the wafer W may be coincident with, or may deviate from, timings of starting and stopping the revolution of the wafer W.

According to the above-described embodiment, in the film forming apparatus 1 for processing the wafers W by supplying the processing gas to the wafers W revolving inside the vacuum container 11, the rotation shaft 32 is provided on the lower surface of the mounting stand 3 for mounting the wafer W thereon, and the mounting stand 3 is revolved by revolving the rotation shaft 32 with the revolution-purpose rotating mechanism 23 provided below the mounting stand 3. Furthermore, the heat transfer plate 2 serving as the bottom surface of the processing space of the wafer W is provided between the mounting stand 3 and the revolution-purpose rotating mechanism 23 over the revolution region of the mounting stand 3. The cutout portion 20 extending along the movement path of the rotation shaft 32 is formed in the heat transfer plate 2. This eliminates the need to rotate the heat transfer plate 2 when revolving the wafer W. This makes it possible to reduce a load borne by the revolution-purpose rotating mechanism 23.

In addition, even in the case of supplying the purge gas below the heat transfer plate 2, for example, the purge gas may enter the hole portions 31a through which the lifting pins 8 are raised and lowered. This may cause a problem of pushing up the wafer W mounted on the mounting stand 3. In the above-described embodiment, the through-holes 200 formed in the heat transfer plate 2 in order to raise and lower the wafer W mounted on the mounting stand 3 may be provided only at the delivery position where the wafer W is delivered to a transfer mechanism provided outside the film forming apparatus 1. Since the mounting stand 3 having the hole portions 31a formed therein revolves independently of the heat transfer plate 2, the purge gas blown out from the heat transfer plate 2 is less likely to be blown into the hole portions 31a formed in the mounting stand 3. Therefore, during the film forming process, it is less likely that the purge gas flowing under the heat transfer plate 2 is blown into the narrow hole portions 31a through which the lifting pins 8 are raised and lowered, consequently pushing up the wafer W.

Further, if the number of mounting stands 3 of the film forming apparatus 1 is increased and if the movement region of the mounting stands 3 is broadened, the bottom surface of the processing region of the wafer W may become large. Therefore, if the mounting stands 3 are formed integrally with the quartz plate constituting the bottom surface of the processing region, a load borne by the revolution-purpose rotating mechanism 23 for revolving the mounting stands 3 greatly increases as the movement region of the mounting stands 3 becomes larger. In the embodiment described above, the quartz-made heat transfer plate 2 and each mounting stand 3 are configured independently of each other, and only the mounting stand 3 is revolved. Therefore, a region through which the mounting stands 3 pass is widened, and the load of the revolution-purpose rotating mechanism 23 is not greatly increased even when the quartz-made heat transfer plate 2 is enlarged. Accordingly, it is possible to increase the number of processed wafers W without greatly improving the revolution-purpose rotating mechanism 23.

Figure 13B:
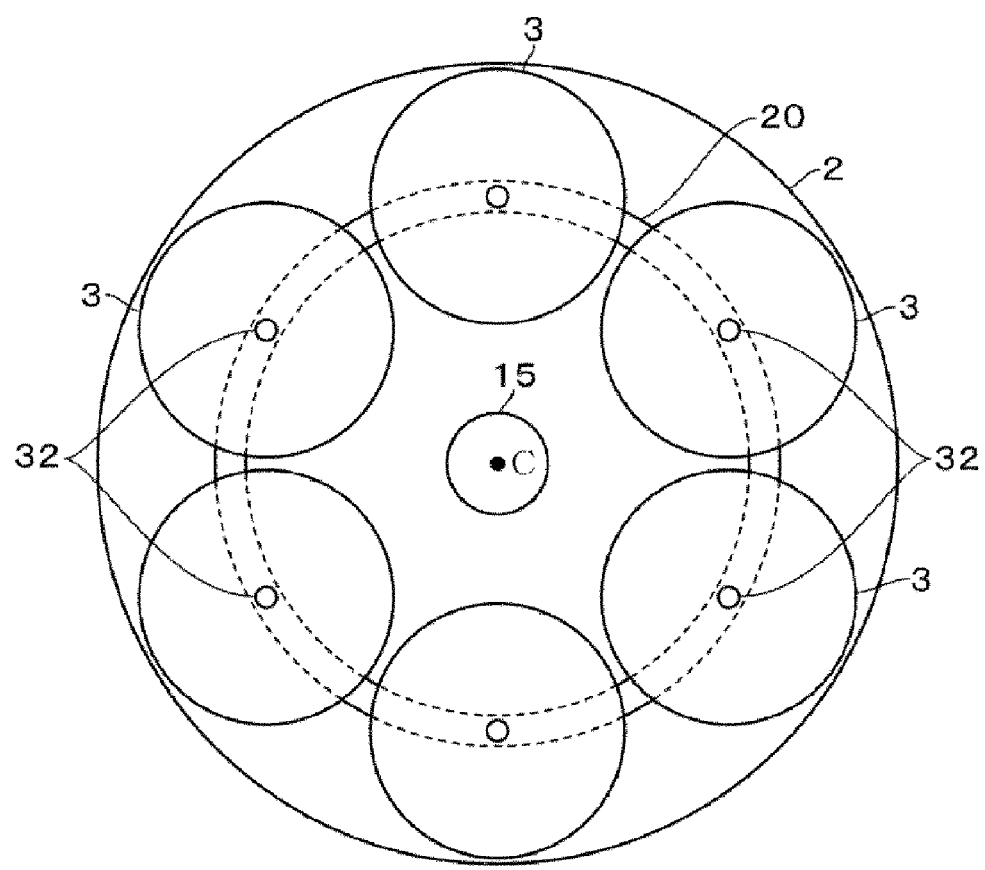

In addition, in the case of a structure in which the quartz-made heat transfer plate 2 and each mounting stand 3 are integrated, if it is attempted to adjust the layout of the mounting stands 3, the heat transfer plate 2 has to be adjusted. This takes time and cost for adjustment. In the above-described embodiment, the heat transfer plate 2 and each mounting stand 3 are configured independently of each other. When the movement trajectory of the mounting stands 3 does not change, there is no need to change the position and size of the cutout portion 20. Therefore, it is not necessary to adjust the heat transfer plate 2. For example, in the embodiment of the present disclosure, there has been described an example in which five mounting stands 3 are provided. However, as shown in FIGS. 13A and 13B, without changing the configuration of the heat transfer plate 2, it is possible to change the installation number of the mounting stands 3 by changing the arrangement interval of the mounting stands 3 within an extent that does not change the movement trajectory of the mounting stands 3. For example, using the heat transfer plate 2 shown in FIG. 2, it is possible to easily realize a configuration in which four mounting stands 3 are provided as shown in FIG. 13A or a configuration in which six mounting stands 3 are provided as shown in FIG. 13B. Moreover, even when each mounting stand 3 deteriorates, it is easy to replace each mounting stand 3 individually.

Further, when the heat transfer plate 2 is rotated, a suitable amount of strength to withstand such a rotation is required. This makes it difficult to configure the heat transfer plate 2 with a plurality of members. In the embodiment described above, the heat transfer plate 2 is fixed to the container body 13. Therefore, for example, the heat transfer plate 2 can be divided in the circumferential direction. In the heat transfer plate 2, gases to be supplied are different depending on portions thereof. Thus, the state of deterioration varies depending on the portions of the heat transfer plate 2. By dividing the heat transfer plate 2, it is possible to replace the heat transfer plate 2 on a portion-by-portion basis.

Figure 14A:
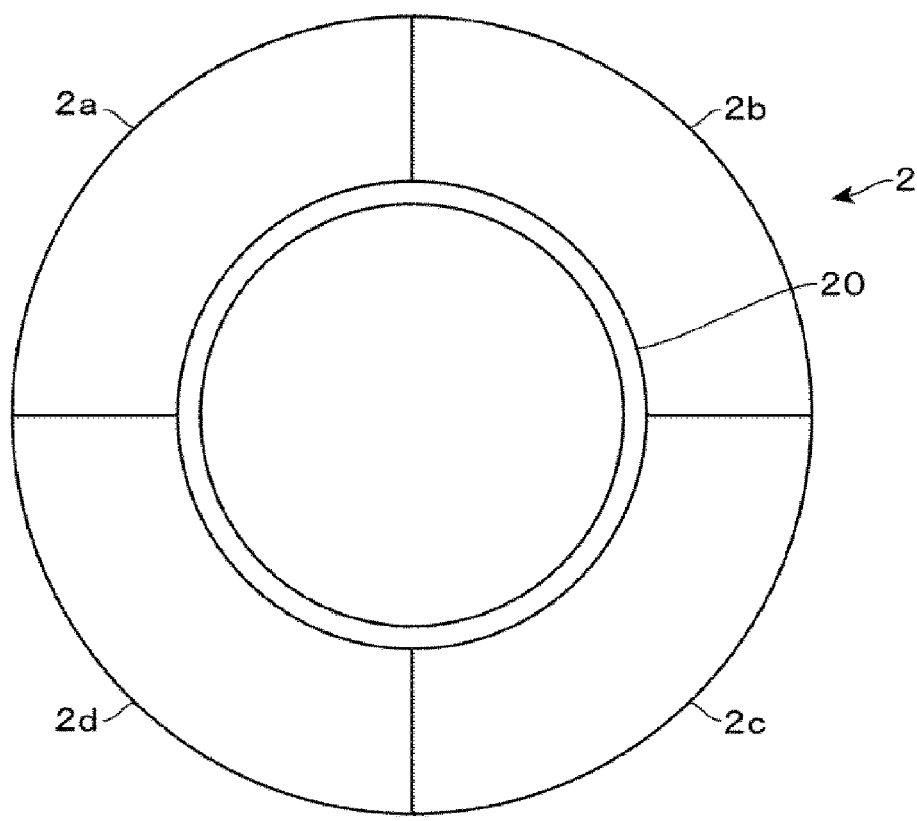
FIGS. 14A and 14B are a plan view and a sectional view showing a heat transfer plate according to another example of the embodiment of the present disclosure.
Figure 14B:
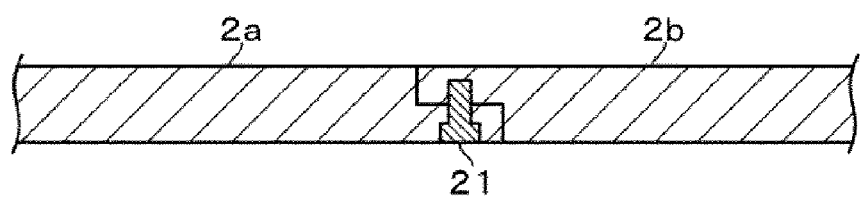

As an example, as shown in FIG. 14A, the heat transfer plate 2 may be configured by, for example, four arcuate members 20a to 20d by dividing an annular portion outside the cutout portion 20 in four equal portions in the circumferential direction. As shown in FIG. 14B, stepped portions are formed in the arcuate members 20a to 20d to engage with each other. Cross sections of the stepped portions are joined to each other by a screw 21 inserted from the lower surface of the heat transfer plate 2. By configuring the heat transfer plate 2 so as to be divided in this way, it is possible to replace the heat transfer plate 2 on a portion-by-portion basis.

In some embodiments, the heater 26 may be embedded in the heat transfer plate 2. By embedding a heating wire 26b in the heat transfer plate 2, there is no need to provide a layer of the heater 26, which makes it possible to downsize the film forming apparatus 1.

Figure 15:
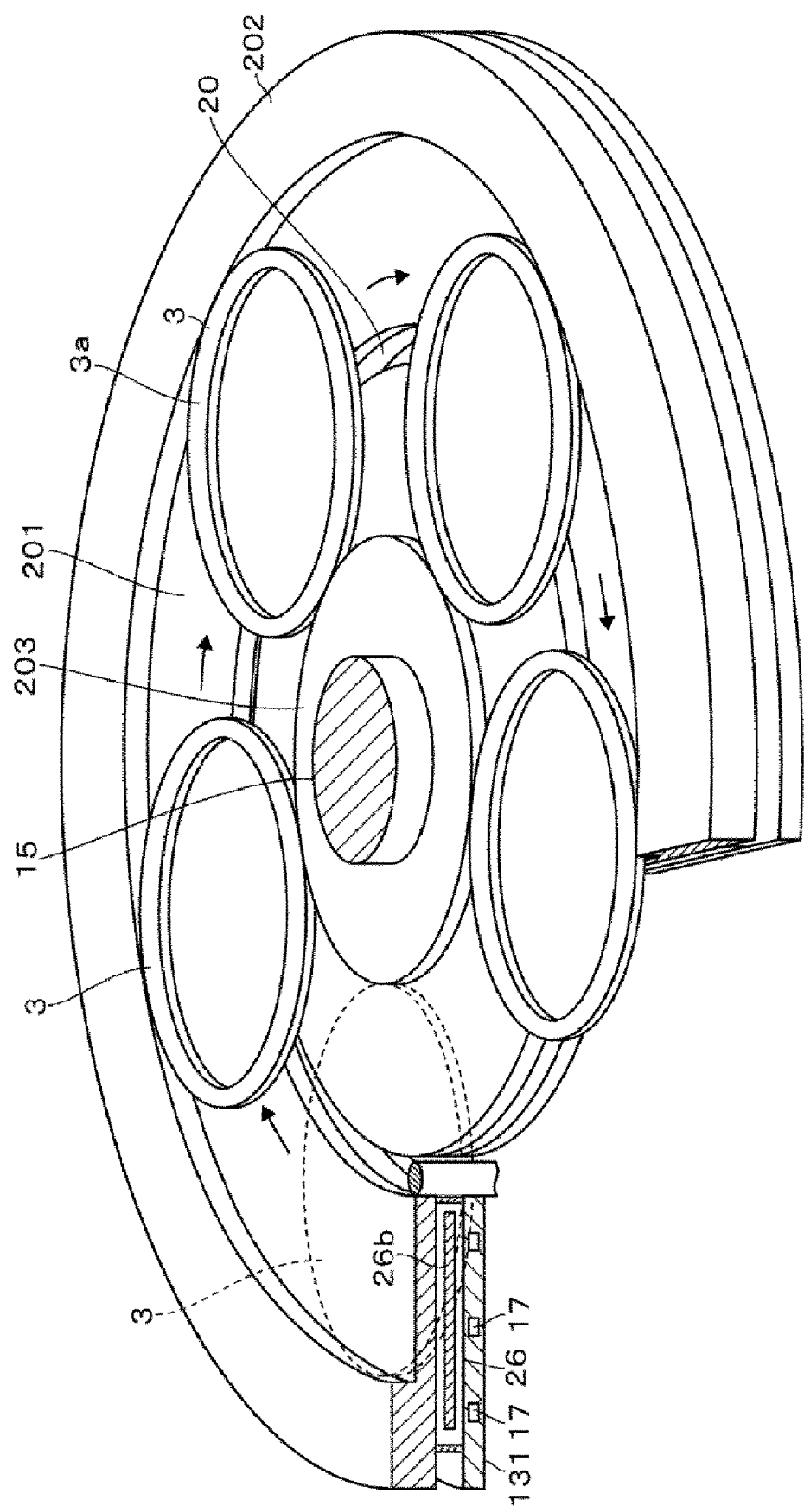
FIG. 15 is a perspective view showing a cross section of a portion of a heat transfer plate according to a further example.

In some embodiments, a recess along which the mounting stands 3 are moved may be formed in the heat transfer plate 2 shown in FIG. 3, and an upper surface of the peripheral edge of the heat transfer plate 2 and an upper surface of the wafer W mounted on the mounting stand 3 may be aligned with each other by height. For example, as shown in FIG. 15, an annular recess 201 along which the mounting stands 3 are moved is formed on the upper surface of the heat transfer plate 2. In this case, a gap between an edge portion 202 at the peripheral edge side of the heat transfer plate 2 and the outer peripheral edge of the mounting stands 3 in the movement region of the mounting stands 3 is a very narrow gap which does not disturb the movement of the mounting stands 3. Furthermore, a gap between an edge portion 203 at the center side of the heat transfer plate 2 and the inner peripheral edge of the mounting stands 3 in the movement region of the mounting stands 3 is also a very narrow gap which does not hinder the movement of the mounting stands 3. In addition, an upper surface of the edge portion 202 at the peripheral edge side of the heat transfer plate 2 and an upper surface of an edge portion 3a of the mounting stand 3 are aligned with each other in height. An upper surface of the edge portion 203 at the center side of the heat transfer plate 2 and an upper surface of the edge portion 3a of the mounting stand 3 are aligned with each other by height. Accordingly, the height of the upper surface of the wafer W mounted on the mounting stand 3, the height of the upper surface of the edge portion 202 at the peripheral edge side of the heat transfer plate 2 and the height of the upper surface of the edge portion 203 at the center side of the heat transfer plate 2 are aligned with each other. When the processing gas is supplied to the adsorption region R1 and the oxidation region R2, the processing gas flows along the upper surfaces of the heat transfer plate 2 and the mounting stands 3, and is supplied to the wafers W. Therefore, by flattening the surfaces on which the processing gas flows and stabilizing the flow of the processing gas, it is possible to improve the in-plane uniformity of the processing of the wafer W.

Since the height of the upper surface of the wafer W mounted on the mounting stand 3, the height of the upper surface of the edge portion 202 at the peripheral edge side of the heat transfer plate 2, the height of the upper surface of the edge portion 203 at the center side of the heat transfer plate 2 and the height of the upper surface of the edge portion 3a of the mounting stand 3 are aligned with each other, undulations are reduced between the surface and surrounding portions of the wafer W. Therefore, the flow of the processing gas flowing on the surface of the wafer W is more likely to be stabilized, so that the in-plane uniformity of the processing of the wafer W is improved.

According to the embodiment of the present disclosure, in order to perform the film forming process on the wafer W while revolving the wafer W mounted on the mounting stand 3, the driven gears 4 are provided in the rotation shaft 32 of the mounting stand 3, and the driving gear 5 constituting the magnetic gear mechanism with the driven gears 4 is provided along the entire circumference of the revolution trajectory of the driven gears 4. Accordingly, by rotating the driving gear 5 and generating the velocity difference between the angular velocity of the driving gear 5 and the angular velocity of the driven gears 4 due to the revolution, the mounting stand 3 is rotated about its own axis. Thus, it is possible to improve the uniformity of the film forming process in the circumferential direction of the wafer W, whereby the in-plane uniformity of the film thickness can be improved.

Figure 16:
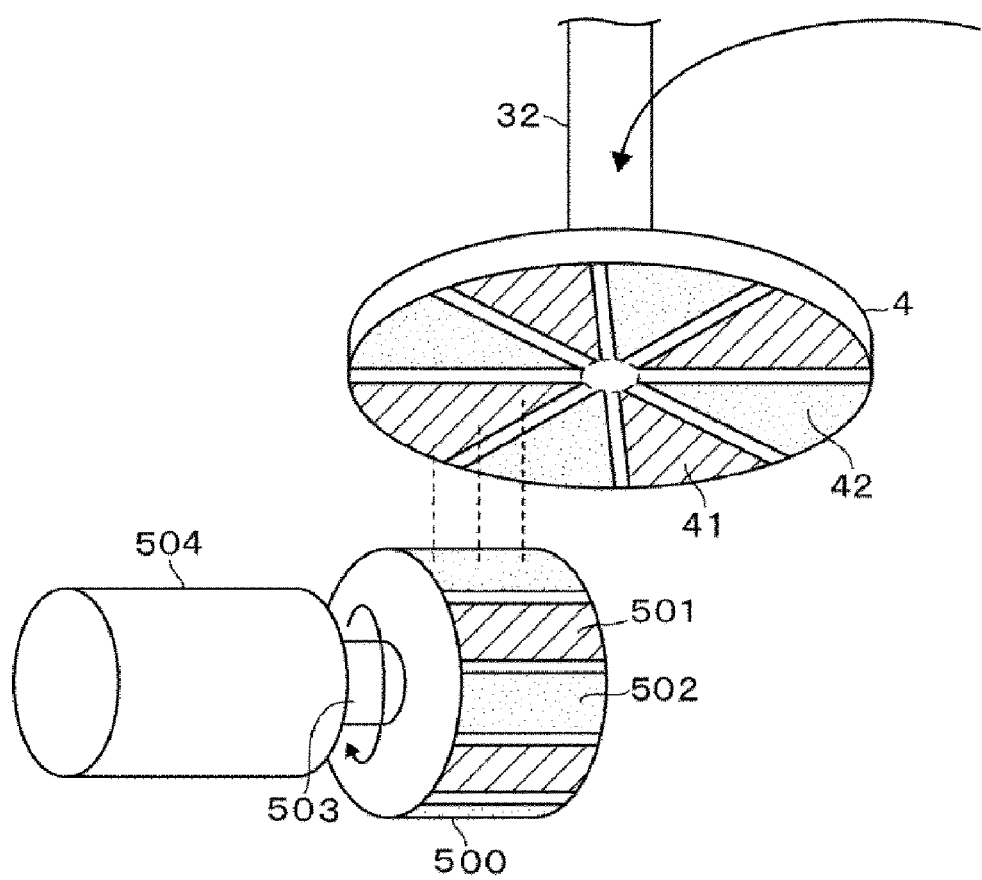
FIG. 16 is an explanatory view showing a magnetic gear mechanism in another example of the embodiment of the present disclosure.

Furthermore, the configuration of the driving gear 5 and the driven gears 4 of the magnetic gear mechanism is not limited to the example shown in FIG. 6 and the like. For example, as shown in FIG. 16, a driving gear 500 may be configured such that N-pole portions 501 and S-pole portions 502 of a plurality of permanent magnets are arranged on a lateral peripheral surface of a cylinder in a spaced-apart relationship with each other. When the driven gear 4 passes through a predetermined position on its revolution trajectory, the driving gear 500 is located at a position where the lateral peripheral surface of the cylinder faces the lower surface (passive surface) of the driven gear 4.

In the driving gear 500, one end of a driving shaft 503 is connected to an inner peripheral surface opposite the lateral peripheral surface on which the N-pole portions 501 and the S-pole portions 502 are disposed. The other end of the driving shaft 503 is connected to a rotational driving part 504. By rotating the driving shaft 503 using the rotational driving part 504, it is possible to rotate the driving gear 500 about its rotational center. In addition, the rotation mechanism for the mounting stand 3 may be constituted by a motor or the like which rotate each mounting stand individually and independently of one another.

For example, when the driving gear 500 is rotated so that the N-pole portions 501 and the S-pole portions 502 of the driving gear 500 move in a direction opposite to the movement direction of the N-pole portions 41 and the S-pole portions 42 of the driven gear 4, magnetic force lines formed between the driving gear 500 and the driven gear 4 are moved so that the driven gear 4 can be rotated. As a result, the mounting stand 3 is rotated about its own axis via the rotation shaft 32 with the rotation of the driven gear 4. Even when the rotation mechanism for rotating the mounting stand 3 has such a configuration, it is not necessary to rotate the heat transfer plate 2 in order to revolve the mounting stand 3. Therefore, it is possible to obtain the same effects.

By allowing the driving gear 5 to trace over the entire circumference of the revolution trajectory of the driven gear 4 as in the film forming apparatus 1 shown in FIG. 6, it is possible to simultaneously drive the driven gears 4 corresponding to the plurality of mounting stands 3. Moreover, the driven gear 4 receives a driving force over the entire circumference of the revolution trajectory. Therefore, by adjusting the difference between the angular velocity of the driving gear 5 and the angular velocity of the driven gear 4 to control the rotation speed, even if the rotation number (revolution speed) of the mounting stand 3 is at a large level of, for example, 80 rpm or more, it is possible to widen the control range. Accordingly, there is an effect that it is possible to improve the uniformity of processing in the circumferential direction of the wafer W while increasing the rotation speed of the mounting stand 3 to enhance the productivity.

Furthermore, since each of the driven gear 4 and the driving gear 5 has the magnetic pole portions made of permanent magnets, it is easy to perform control for the rotation operation, which makes it possible to set the production cost at a low cost.

In the above-described embodiment, the partition member 37 made of a material through which magnetic force lines pass is provided between the driven gears 4 and the driving gear 5 so as to partition an air atmosphere and a vacuum atmosphere. The driving gear 5 is provided at the atmospheric side. Therefore, even if particles are generated at the side of the driving gear 5, the entry of the particles into the vacuum container 11 is suppressed. This facilitates electrical control and maintenance. Moreover, since the driving gear 5 is provided at the atmospheric side and the driven gears 4 are disposed in a region spaced apart from the heater 26, it is possible to suppress a decrease in magnetic force due to a high temperature.

Even in the case of a configuration in which the driving gear 5 and the rotation-purpose rotating mechanism 53 are provided inside the compartment 36, by configuring the mounting stands 3 and the heat transfer plate 2 so as to be independent from each other, it is possible to reduce the load borne by the revolution-purpose rotating mechanism 23. Therefore, it is possible to obtain the same effects.

Furthermore, by setting the angular velocity of the driving gear 5 up to a value at which the velocity difference between the angular velocity of the driven gear 4 due to the revolution and the angular velocity of the driving gear 5 and the rotation speed of the driven gear 4 are maintained in a substantially proportional relationship, it is possible to easily set the rotation speed of the driven gear 4. This facilitates the control. In addition, the memory part 103, the input part 104 and the data processing part 105 are provided in the control part 100. Thus, for example, by inputting the rotation speed of the driven gear 4 to the input part 104 to change the rotation speed of the mounting stand 3, it is possible to automatically set the rotation number of the driving gear 5. This facilitates the rewriting of a recipe and the maintenance.

The present disclosure described above encompasses a case where one of the driven gear 4 and the driving gear 5 is a magnetic pole portion and the other is a magnetic body.

Furthermore, the present disclosure encompasses a case where the driven gear 4 is formed of one of the N-pole portions 41 and the S-pole portions 42 or formed of the N-pole portions 41 and the S-pole portions 42 alternately arranged, and the driving gear 5 is made of a magnetic body. Moreover, the present disclosure encompasses a case where the driving gear 5 is formed of one of the N-pole portions 51 and the S-pole portions 52 or formed of the N-pole portions 51 and the S-pole portions 52 alternately arranged, and the driven gear 4 is made of a magnetic body. In the case where the driven gears 4 and the driving gear 5 are provided as in the above-described embodiment, each of the mounting stands 3 is rotated about its own axis by virtue of the repulsion force and the attraction force of magnets. Therefore, it is possible to reliably rotate the mounting stands 3. However, in a case where only one of the driven gear 4 and the driving gear 5 is a magnetic body, the mounting stand 3 may be formed in a small size in order to reliably rotate the mounting stand 3.

Further, in the above-described embodiment, each of the mounting stands 3 has been described to be revolved while rotating about its own axis. However, it may be possible to adopt a film forming apparatus in which each mounting stand is revolved without rotating about its own axis. Even in this case, the revolution-purpose rotating mechanism 23 does not need to rotate the heat transfer plate 2 constituting the bottom surface portion of the processing space, but may revolve only the mounting stands 3. Thus, there is an effect of suppressing an increase in a load borne by the revolution-purpose rotating mechanism 23.

Further, the gas supply part of the present disclosure may have a configuration in which an annular exhaust port is formed so as to surround the gas discharge region and an annular separation gas supply hole for supplying a separation gas therethrough is formed around the exhaust port.

In addition, the present disclosure may be applied to an apparatus for performing a film forming process on a substrate by a CVD method.

According to the present disclosure, in a substrate processing apparatus for processing a substrate by supplying a processing gas to the substrate revolving inside a processing container, a mounting stand on which the substrate is mounted is supported by a support rod. The mounting stand is revolved by revolving the support rod with a revolution mechanism provided below the mounting stand. In addition, a heating part is provided between the mounting stand and the revolution mechanism as viewed in the height direction. A heat transfer plate for radiating heat generated from the heating part to a revolution region is provided between the mounting stand and the heating part. Furthermore, each of the heating part and the heat transfer plate is divided into a center side and an outer side of the processing container so as to form a movement path of the support rod. Thus, the substrate can revolve by revolving the mounting stand without rotating the heat transfer plate. This makes it possible to reduce a load borne by a rotation mechanism.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for performing a film formation by supplying a processing gas to a substrate inside a processing container, comprising:
   a mounting stand configured to mount the substrate thereon;
   a support rod configured to support the mounting stand from below;
   a revolution mechanism provided below the mounting stand and configured to support the support rod to revolve the mounting stand in a circumferential direction of the processing container;
   a heater provided between the mounting stand and the revolution mechanism as seen in a height direction and configured to heat a revolution region of the mounting stand;
   a heat transfer plate provided between the heater and the revolution region of the mounting stand and configured to radiate a heat generated from the heater to the revolution region;
   a processing gas nozzle configured to supply the processing gas to the revolution region of the mounting stand; and
   a rotation mechanism configured to rotate the support rod about a rotation axis thereof,
   wherein each of the heater and the heat transfer plate is divided into a center side and an outer side of the processing container via a gap so as to form a movement path of the support rod,
   wherein the rotation mechanism includes:
   a driven gear provided in the support rod and configured to rotate such that the support rod rotates about the rotation axis;
   a driving gear provided to face a revolution trajectory of the driven gear and constituting a magnetic gear mechanism with the driven gear; and
   a gear rotating mechanism configured to rotate the driving gear, and
   wherein the driving gear is formed extending along an entire circumference of the revolution trajectory of the driven gear.

2. The apparatus of claim 1, further comprising:
   a support post configured to support a central portion of a lower surface of the heat transfer plate,
   wherein the revolution mechanism is formed in an annular shape so as to surround the support post and includes a rotation plate configured to rotate in a circumferential direction to revolve the mounting stand.

3. The apparatus of claim 2, further comprising:
   a lifter configured to push up the substrate from below to raise and lower the substrate mounted on the mounting stand which is located at a delivery position where the substrate is delivered,
   wherein the lifter extends downward relative to the rotation plate.

4. The apparatus of claim 1, wherein the processing gas nozzle includes:
   a first gas nozzle configured to supply a raw material gas toward a first processing region which is a portion of the revolution region of the mounting stand; and
   a second gas nozzle configured to supply a reaction gas reacting with the raw material gas to a second processing region spaced apart from the first processing region in a circumferential direction of the processing container via a separation region to which a separation gas is supplied.

5. The apparatus of claim 1, wherein the heat transfer plate is composed of a plurality of members divided in the circumferential direction.

6. The apparatus of claim 1, wherein the support rod is rotatably supported by the revolution mechanism.

7. The apparatus of claim 1, wherein the driven gear includes first N-pole portions and first S-pole portions alternately arranged along a rotation direction over an entire circumference, and the driving gear includes second N-pole portions and second S-pole portions alternately arranged along the revolution trajectory over the entire circumference.

8. The apparatus of claim 1, wherein the first N-pole portions and the first S-pole portions of the driven gear are provided on a lower surface of the driven gear so as to extend radially from a central portion thereof in a lateral direction, and
  the second N-pole portions and the second S-pole portions of the driving gear are arranged on a surface facing the lower surface of the driven gear in the driving gear.

9. The apparatus of claim 1, wherein an angular velocity of the driving gear is set between a value at which an absolute value of a velocity difference between an angular velocity of the driven gear due to revolution and the angular velocity of the driving gear is zero and a value at which the velocity difference and a rotation speed of the driven gear are maintained in a substantially proportional relationship.

10. The apparatus of claim 9, further comprising:
  a memory device storing a relationship between the rotation speed of the driven gear and the velocity difference;
  an input device configured to input the rotation speed of the driven gear; and
  a data processor configured to set a rotation number of the driving gear based on the inputted rotation speed of the driven gear, a revolution number of the mounting stand and the relationship stored in the memory device.

* * * * *